US009832895B2

(12) United States Patent
Tsuzuki

(10) Patent No.: US 9,832,895 B2
(45) Date of Patent: Nov. 28, 2017

(54) DISPLAY DEVICE

(71) Applicant: Saturn Licensing LLC, New York, NY (US)

(72) Inventor: Masatomo Tsuzuki, Chiba (JP)

(73) Assignee: Saturn Licensing LLC, New York, NY (US)

( * ) Notice: Subject to any disclaimer, the term of this patent is extended or adjusted under 35 U.S.C. 154(b) by 554 days.

(21) Appl. No.: 14/215,252

(22) Filed: Mar. 17, 2014

(65) Prior Publication Data

US 2014/0293140 A1    Oct. 2, 2014

(30) Foreign Application Priority Data

Mar. 26, 2013  (JP) ................................ 2013-064398

(51) Int. Cl.
*H05K 5/02* (2006.01)
*H04N 5/655* (2006.01)
(Continued)

(52) U.S. Cl.
CPC ....... *H05K 5/0234* (2013.01); *H04N 1/00562* (2013.01); *H04N 5/64* (2013.01);
(Continued)

(58) Field of Classification Search
CPC ...... H05K 5/0204; H05K 5/0234; H04N 5/64; H04N 5/655; H04N 1/00562; G06F 1/1601
(Continued)

(56) References Cited

U.S. PATENT DOCUMENTS 4,386,372 A * 5/1983 Slater .................. H04N 9/3141
348/782
4,394,681 A * 7/1983 Rowe .................. H04N 9/3141
348/780
(Continued)

FOREIGN PATENT DOCUMENTS

CN          101253360         11/2007
CN          201004327         1/2008
(Continued)

OTHER PUBLICATIONS

Office Action issued Aug. 23, 2017 in Chinese Patent Application No. 201410101712.2.

*Primary Examiner* — Eret McNichols
(74) *Attorney, Agent, or Firm* — Oblon, McClelland, Maier & Neustadt, L.L.P.

(57) ABSTRACT

A display device includes an assembly including a stand placed on an installation plane, a flat-plate-like display section supported by the stand, and a weight object provided on a back face side of the display section, the stand having a contact portion in contact with the installation plane, the contact portion being provided inside a first triangle formed by second and third straight lines and the installation plane, the second and third straight lines both passing through center of gravity of the display section and forming, with respect to a first straight line, an angle equal to a back-falling angle and a front-falling angle of the assembly, respectively, and the first straight line passing through the center of gravity of the display section and being perpendicular to the installation plane.

9 Claims, 22 Drawing Sheets

(51) Int. Cl.
  *H04N 1/00* (2006.01)
  *H04N 5/64* (2006.01)
  *G06F 1/16* (2006.01)

(52) U.S. Cl.
  CPC ........... *H04N 5/655* (2013.01); *H05K 5/0204* (2013.01); *G06F 1/1601* (2013.01)

(58) Field of Classification Search
  USPC ....... 348/836; 361/679.59; 248/162.1, 406.2, 248/123.2, 182.1, 364
  See application file for complete search history.

(56) References Cited

U.S. PATENT DOCUMENTS

| | | | | | |
|---|---|---|---|---|---|
| 4,621,293 | A | * | 11/1986 | Matis | H04N 9/3141 348/745 |
| 5,084,807 | A | * | 1/1992 | McKechnie | H04N 9/315 348/E9.027 |
| 5,317,449 | A | * | 5/1994 | Furuno | G03B 21/10 348/E5.138 |
| 5,363,149 | A | * | 11/1994 | Furuno | H04N 9/3147 312/7.2 |
| 6,545,729 | B1 | * | 4/2003 | Lowe | H04N 9/3141 312/72 |
| 6,688,713 | B2 | * | 2/2004 | Lowe | A47B 81/06 312/351.2 |
| 6,873,374 | B2 | * | 3/2005 | Hori | H04N 9/3141 348/787 |
| 7,896,299 | B2 | * | 3/2011 | Chinuki | F16M 11/06 248/127 |
| 8,411,433 | B2 | * | 4/2013 | Take | F16M 11/22 248/917 |
| 8,418,987 | B2 | * | 4/2013 | Kakuta | F16M 13/00 248/917 |
| 8,593,796 | B2 | * | 11/2013 | Takao | F16M 11/08 248/222.14 |
| 8,854,352 | B2 | * | 10/2014 | Matsui | G06F 1/26 345/204 |
| 9,195,084 | B2 | * | 11/2015 | Yokawa | G02F 1/133308 |
| 2003/0107144 | A1 | * | 6/2003 | Lowe | H04N 9/3141 264/45.4 |
| 2004/0032189 | A1 | * | 2/2004 | Lowe | A47B 81/06 312/7.2 |
| 2008/0186664 | A1 | * | 8/2008 | Chang | H05K 7/20963 361/679.01 |
| 2013/0155587 | A1 | * | 6/2013 | Take | H05K 5/0204 361/679.01 |
| 2013/0258212 | A1 | * | 10/2013 | Ooe | H04N 5/64 348/836 |
| 2014/0085798 | A1 | * | 3/2014 | Myerchin | F16M 11/046 361/679.22 |
| 2017/0064851 | A1 | * | 3/2017 | Shin | H05K 5/0226 |

FOREIGN PATENT DOCUMENTS

| | | |
|---|---|---|
| CN | 101079213 | 8/2008 |
| CN | 102005158 | 4/2011 |
| CN | 102889456 | 1/2013 |
| JP | 11-251758 A | 9/1999 |

* cited by examiner

DISPLAY DEVICE

CROSS REFERENCE TO RELATED APPLICATION(S)

This application claims the benefit of Japanese Priority Patent Application JP 2013-064398 filed Mar. 26, 2013, the entire contents of each which are incorporated herein by reference.

BACKGROUND

Present disclosure relates to a display device suitable, for example, for a television.

For example, Japanese Unexamined Patent Application Publication No. H11-251758 (JPH11-251758A) discloses to provide a weight on a rack that supports a planar PDP unit, and thereby, to avoid falling-down of the display device and to stably hold the display device.

SUMMARY

However, the display device disclosed in JPH11-251758A has an issue that the rack protrudes largely to the back of the PDP unit, and therefore, an installation area is large.

It is desirable to provide a display device capable of reducing an installation area.

A display device according to an embodiment of the present disclosure includes an assembly including a stand placed on an installation plane, a flat-plate-like display section supported by the stand, and a weight object provided on a back face side of the display section. The stand has a contact portion in contact with the installation plane. The contact portion is provided inside a first triangle formed by a second straight line, a third straight line, and the installation plane. The second straight line passes through center of gravity of the display section and forms, with respect to a first straight line, an angle equal to a back-falling angle of the assembly. The third straight line passes through the center of gravity of the display section and forms, with respect to the first straight line, an angle equal to a front-falling angle of the assembly. The first straight line passes through the center of gravity of the display section and is perpendicular to the installation plane.

In the display device according to the above-described embodiment of the present disclosure, the weight object is provided on the back face side of the display section, and the contact portion, of the stand, in contact with the installation plane is provided inside the above-described first triangle that includes the center of gravity of the display section as a vertex. In this case, the center of gravity of the assembly is determined based on a weight ratio between the display section and the weight object on a straight line that connects the center of gravity of the display section and the center of gravity of the weight object. By appropriately setting the position and the weight of the weight object, it is possible to position the center of gravity of the assembly above the contact portion, of the stand, in contact with the installation plane. Therefore, falling-down of the assembly is suppressed even when the depth of the stand is small, and the assembly is supported in favorable balance.

According to the display device of the above-described embodiment of the present disclosure, the weight object is provided on the back face side of the display section, and the contact portion, of the stand, in contact with the installation plane is allowed to be formed inside the above-described first triangle. Therefore, the installation area is reduced.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1:
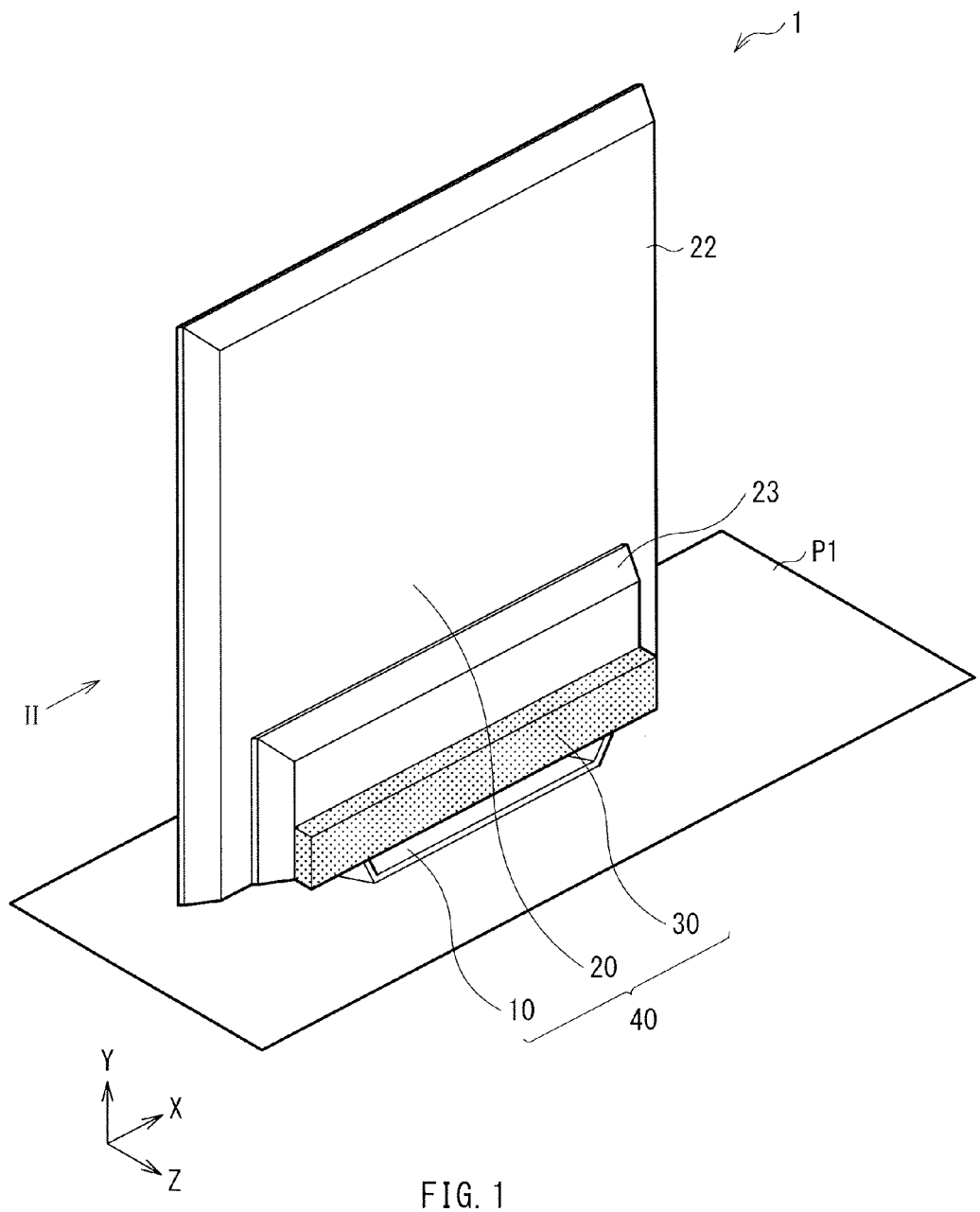
FIG. 1 is a perspective view illustrating an appearance of a display device according to a first embodiment of the present disclosure seen from a back face side thereof.

Some embodiments of the present disclosure will be described below in detail referring to the drawings. The description will be provided in the following order:
1. First Embodiment (an example in which a weight is added in a position that is outside the display section and is in the lower-back of the display section)
2. Second Embodiment (an example in which the weight is built in the display section)
3. Third Embodiment (an example in which a back face of the display section is configured to be a sloped face that has a constant slope, and thereby, a thickness of the display section is gradually increased from a top end thereof to a bottom end thereof)
4. Fourth Embodiment (an example in which a transition section having a curved face is provided on the back face of the display section, and the transition section connects an upper portion of the display section having a smaller thickness to a lower portion of the display section having a larger thickness)
5. Fifth Embodiment (an example having a curved display section)

First Embodiment

Figure 2:
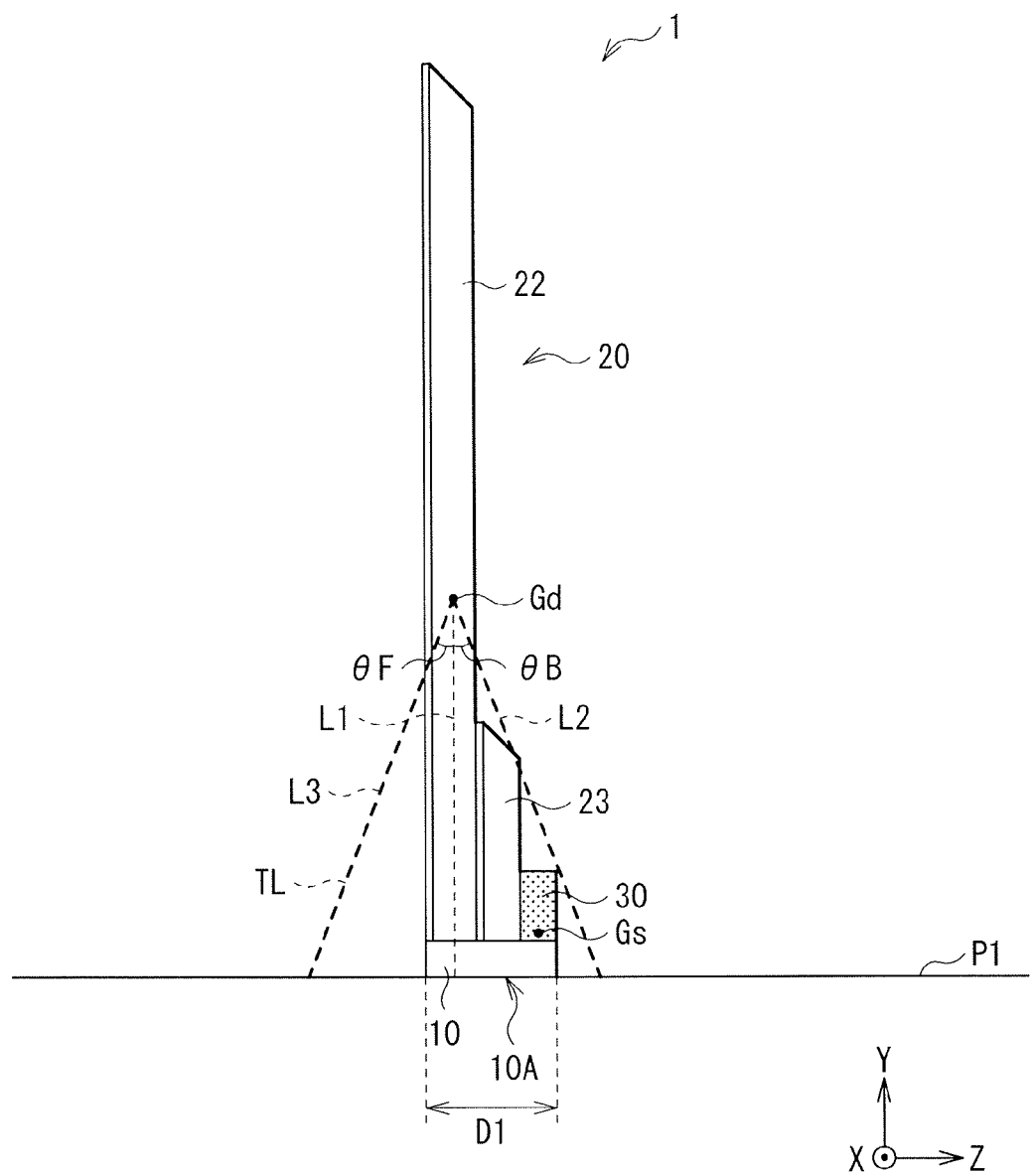
FIG. 2 is a left side view of the display device shown in FIG. 1.

FIG. 1 illustrates an appearance of a display device (a display device 1) according to a first embodiment of the present disclosure seen from a back face side thereof. FIG. 2 illustrates the appearance of this display device seen from a direction of an arrow II (seen from a left side thereof) in FIG. 1. The display device 1 may be used, for example, as a television. The display device 1 includes a stand 10, a flat-plate-like display section 20, and a weight object 30. The stand 10 is placed on a horizontal installation plane P1. The display section 20 is supported by the stand 10. The weight object 30 is provided in the lower-back of the back face of the display section 20. The stand 10, the display section 20, and the weight object 30 configure an assembly 40.

In the present specification, a direction (a front-back direction) perpendicular to a main face (a largest face) of the display device 1 is expressed as a Z direction, a right-left direction in the main face of the display device 1 is expressed as an X direction, and a top-bottom direction in the main face of the display device 1 is expressed as an Y direction. "Right" and "left" are used as those seen from the back face side.

The stand 10 may be formed, for example, by bending a belt-like metal plate as shown in FIG. 1. The stand 10 may be attached, for example, to the middle of the lower portion of the display section 20. It is to be noted that a shape of the stand 10 shown in FIG. 1 is a mere example, and it goes without saying that the shape of the stand 10 is not limited to this example. Also, the position to attach the stand 10 is not limited to the middle of the lower portion of the display section 20.

Figure 3:
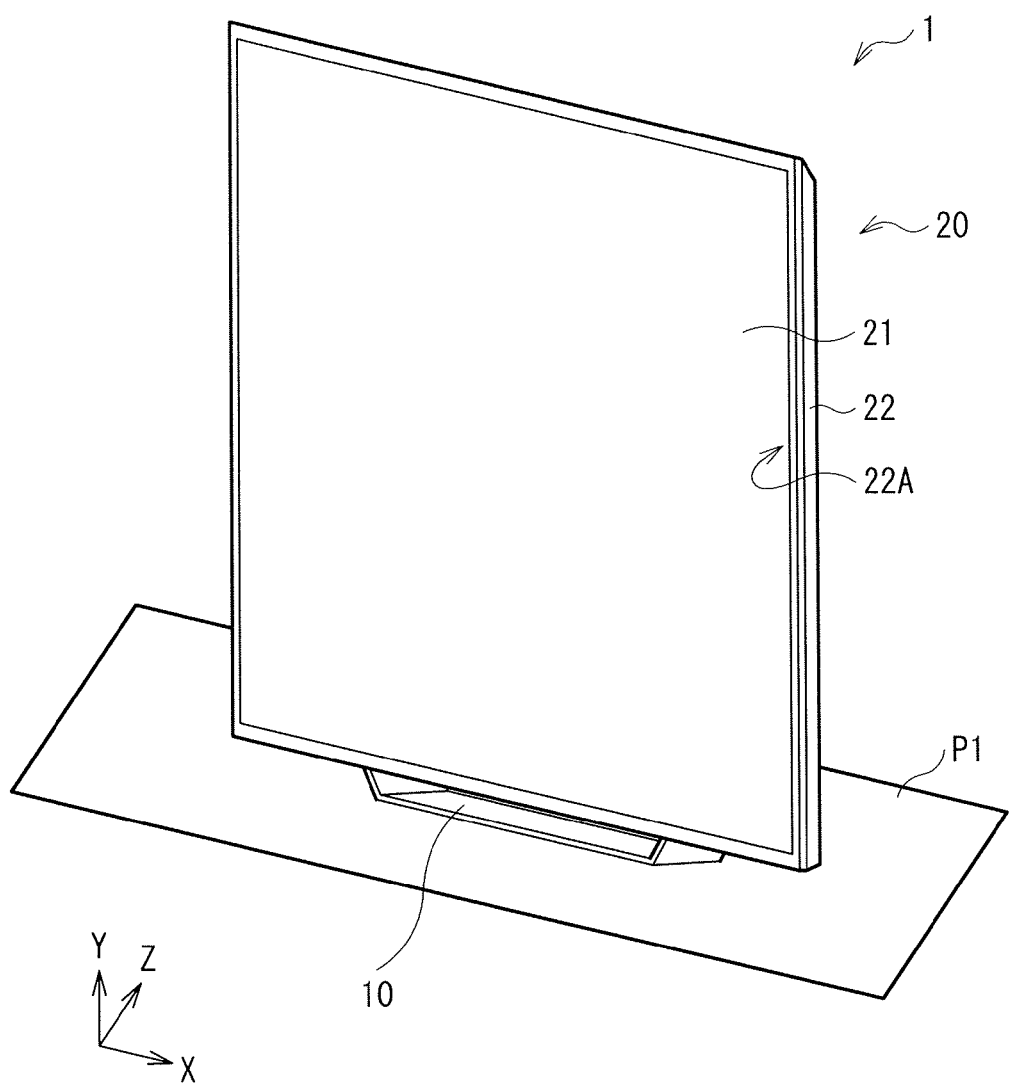
FIG. 3 is a perspective view illustrating the appearance of the display device shown in FIG. 1 seen from a front face side thereof.

As shown in FIG. 3, the display section 20 may have, for example, a configuration in which a display panel 21 made of a material such as liquid crystal or organic EL (Electroluminescence) is contained in a housing 22. The housing 22 has an aperture 22A in a front face thereof. A viewer is allowed to visually perceive an image displayed on the display panel 21 through the aperture 22A. A region in a lower portion of the back face of the display section 20 (the housing 22) is covered with a covering member 23. The covering member 23 may include a power source and substrates (which are not illustrated) inside thereof. Alternatively, the covering member 23 may contain a component such as an audio generation device (speaker) (which is not illustrated). Center of gravity Gd of the display section 20 is in a position that is lower in some degrees than the middle of the display section 20 since the components such as the power source, the substrates, and the speaker are provided in the lower portion of the back face of the display section 20.

The weight object 30 is provided to reduce an installation area (a depth D1) while securing a falling angle of the display device 1. "Falling angle" herein refers to a degree of difficulty in falling-down of the assembly 40 (an angle to which the assembly 40 is allowed to be tilted without falling down). It is to be noted that, standard (UL19.1) defines that the falling angle is set to be 10° in all directions. It may be important to secure falling angles particularly in the front and the back, for example, in the assembly 40 that includes the flat-plate-like display section 20 shown in FIGS. 1 and 2. Description will be given below on a case in which a back-falling angle θB of the assembly 40 is 10°, for example, and a front-falling angle θF of the assembly 40 is 10°, for example.

The weight object 30 is provided on the back face side of the display section 20. Specifically, the weight object 30 may be provided, for example, in a lower portion outside the back face of the display section 20. By providing the weight object 30 in the lower portion outside the back face of the display section 20, it is possible to secure a space for connection of cables (not illustrated), etc. outside the back face of the display section 20. Center of gravity Gs of the weight object 30 is in a position in vicinity of a bottom face of the weight object 30.

The weight object 30 may be preferably a weight configured of a metal block such as an electro-galvanized steel plate (SECC), for example. A shape of the weight object 30 is not particularly limited. However, the shape of the weight object 30 may be, for example, a rod-like shape that has a rectangular cross-section as shown in FIGS. 1 and 2.

In the display device 1, as shown in FIG. 2, a contact portion 10A, of the stand 10, in contact with the installation plane P1 is provided inside a first triangle TL that is formed by a second straight line L2, a third straight line L3, and the installation plane P1. The second straight line L2 forms, with respect to a first straight line L1, an angle equal to the back-falling angle θB of the assembly 40. The third straight line L3 forms, with respect to the first straight line L1, an angle equal to the front-falling angle θF of the assembly 40. The first straight line L1 passes through the center of gravity Gd of the display section 20, and is perpendicular to the installation plane P1. Accordingly, in the display device 1, it is possible to reduce the installation area.

Figure 4:
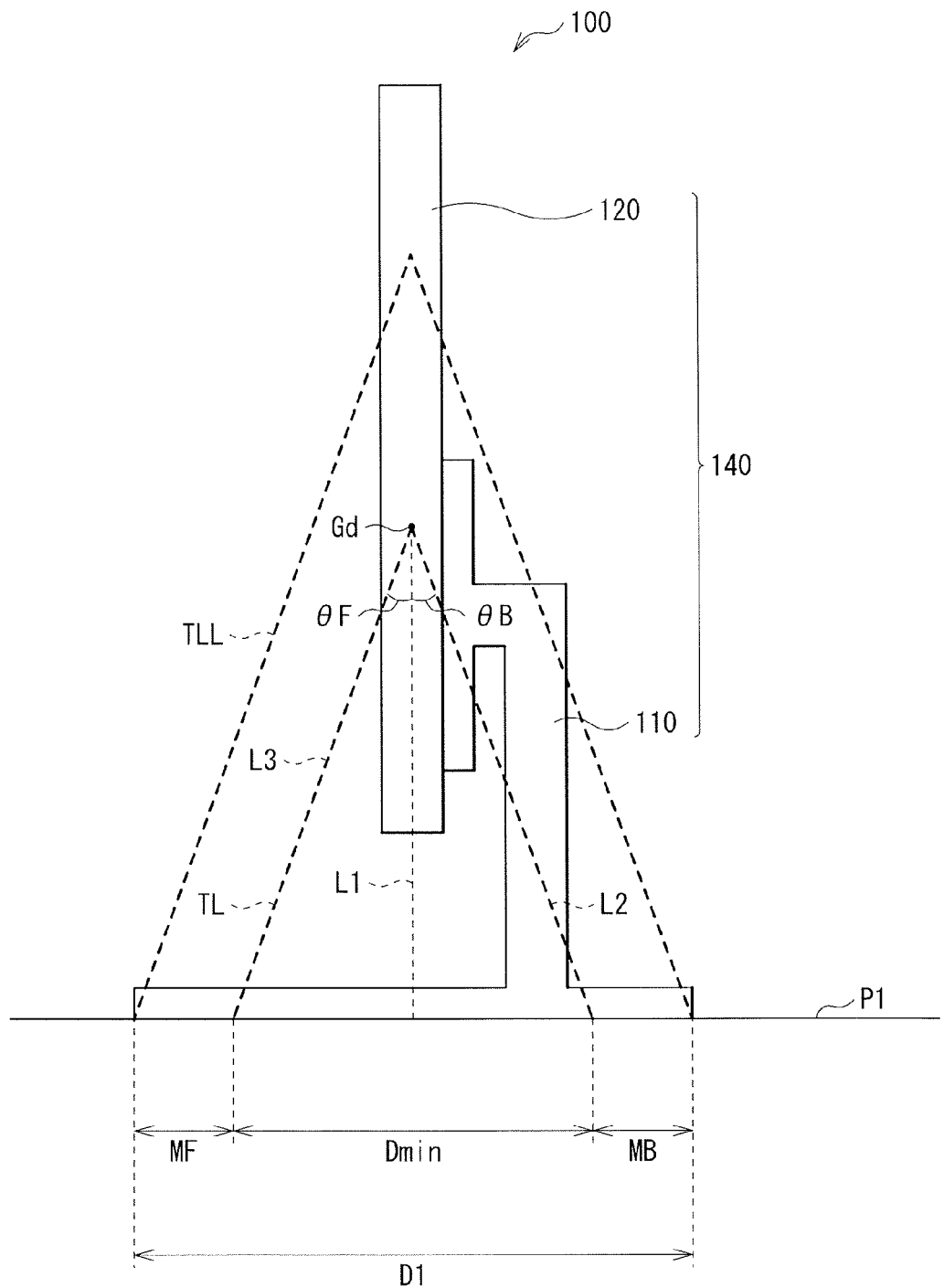
FIG. 4 is a left side view for explaining a lower limit of a depth of a stand of a typical display device.

This will be described below. As shown in FIG. 4, a typical display device 100 includes no weight object 130, and includes an assembly 140 that is configured only of a stand 110 and a display section 120. The stand 110 protrudes largely in the front and the back of the display section 120 in order to secure a front-falling angle θF and a back-falling angle θB of the assembly 140.

A lower limit Dmin of a depth of the stand 110 corresponds to a base of the above-described first triangle TL that includes center of gravity Gd of the display section 120 as a vertex. A depth D1 of the stand 110 is not shorter than the base of the first triangle TL. One reason for this is that, if the depth D1 of the stand 110 is shorter than the base of the first triangle TL, it becomes difficult to secure the back-falling angle θB and the front-falling angle θF, and therefore, the assembly 140 may easily fall down.

It is to be noted that, actually, the depth D1 of the stand 110 includes buffers MF and MB in the front and the back of the above-described first triangle TL, and is set to be larger than the base of the above-described first triangle TL (D1=Dmin+MF+MB). It is to be noted that a third triangle TLL which is the largest triangle in FIG. 4 is a triangle illustrated using the actual depth D11 of the stand 110 as a base.

Figure 5:
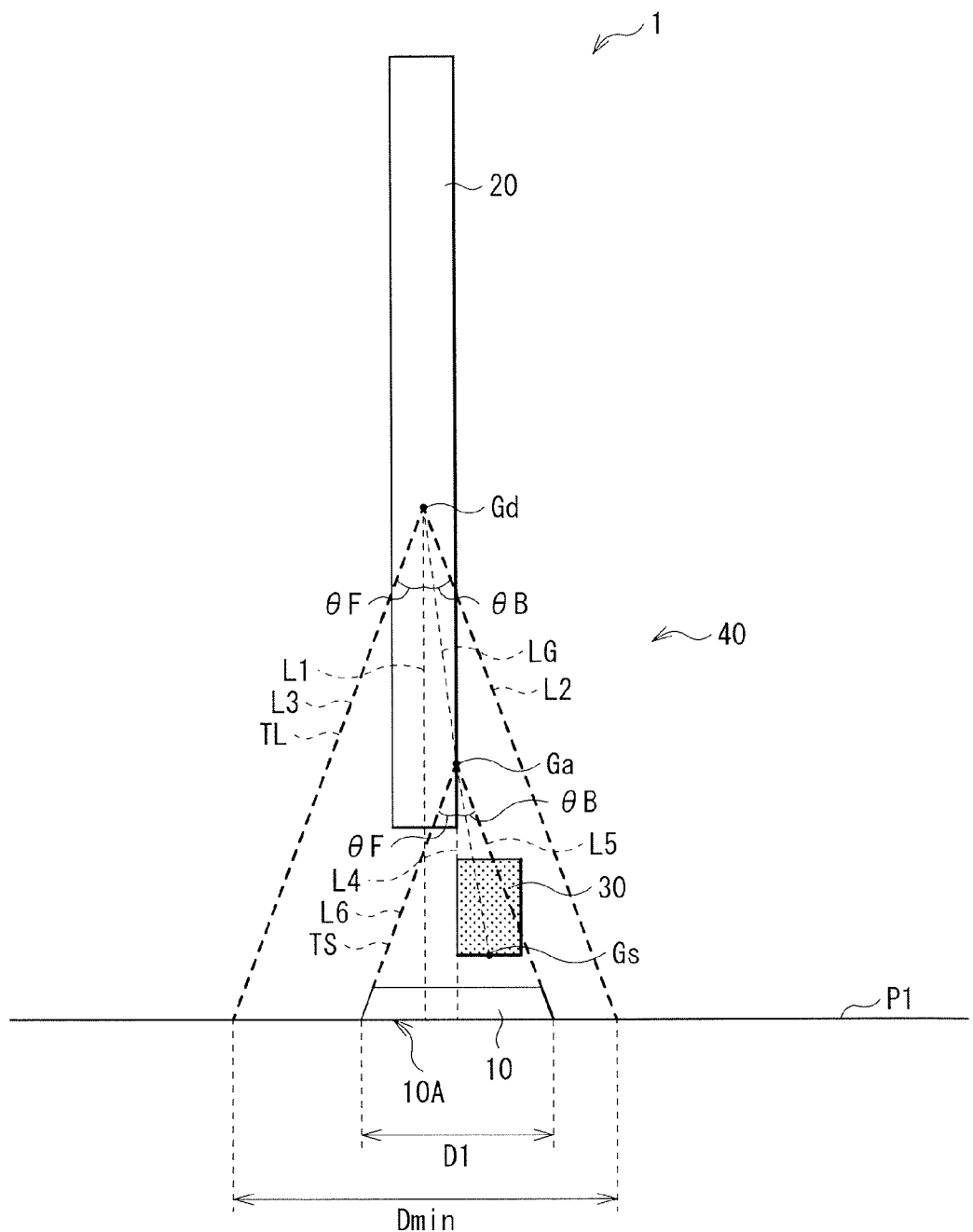
FIG. 5 is a left side view for explaining a relationship between a first triangle shown in FIG. 4 and a stand of the display device of the first embodiment.

On the other hand, as shown in FIG. 5, in the present embodiment, the weight object 30 is provided on the back face side of the display section 20. In this case, a center of gravity Ga of the assembly 40 is determined based on a weight ratio between the display section 20 and the weight object 30 on a straight line LG that connects the center of gravity Gd of the display section 20 and the center of gravity Gs of the weight object 30. By appropriately setting the position and the weight of the weight object 30, it is possible to position the center of gravity Ga of the assembly 40 above the contact portion 10A, of the stand 10, in contact with the installation plane P1. Therefore, falling-down of the assembly 40 is suppressed even when the depth D1 of the stand 10 is small, and the assembly 40 is supported in favorable balance.

Moreover, the center of gravity Ga of the assembly 40 may be preferably positioned right above the middle of the contact portion 10A, of the stand 10, in contact with the installation plane P1. Thus, the assembly 40 is supported in best balance.

As shown in FIG. 5, the contact portion 10A, of the stand 10, in contact with the installation plane P1 configures a base of a second triangle TS formed by a fifth straight line L5, a sixth straight line L6, and the installation plane P1. The fifth straight line L5 forms, with respect to a fourth straight line L4, an angle equal to the back-falling angle θB of the assembly 40. The sixth straight line L6 forms, with respect to the fourth straight line L4, an angle equal to the front-falling angle θF of the assembly 40. The fourth straight line L4 passes through the center of gravity Ga of the assembly 40 and is perpendicular to the installation plane P1. By appropriately setting the position and the weight of the weight object 30, the second triangle TS that includes the center of gravity Ga of the assembly 40 as a vertex is allowed to be formed inside the first triangle TL that includes the center of gravity Gd of the display section 20 as a vertex.

The display device 1 is allowed to be manufactured by a commonly-known manufacturing method except that the weight object 30 is provided in the lower portion of the back face of the display section 20. In this case, the position and the weight of the weight object 30 may be set as follows, for example.

Figure 6:
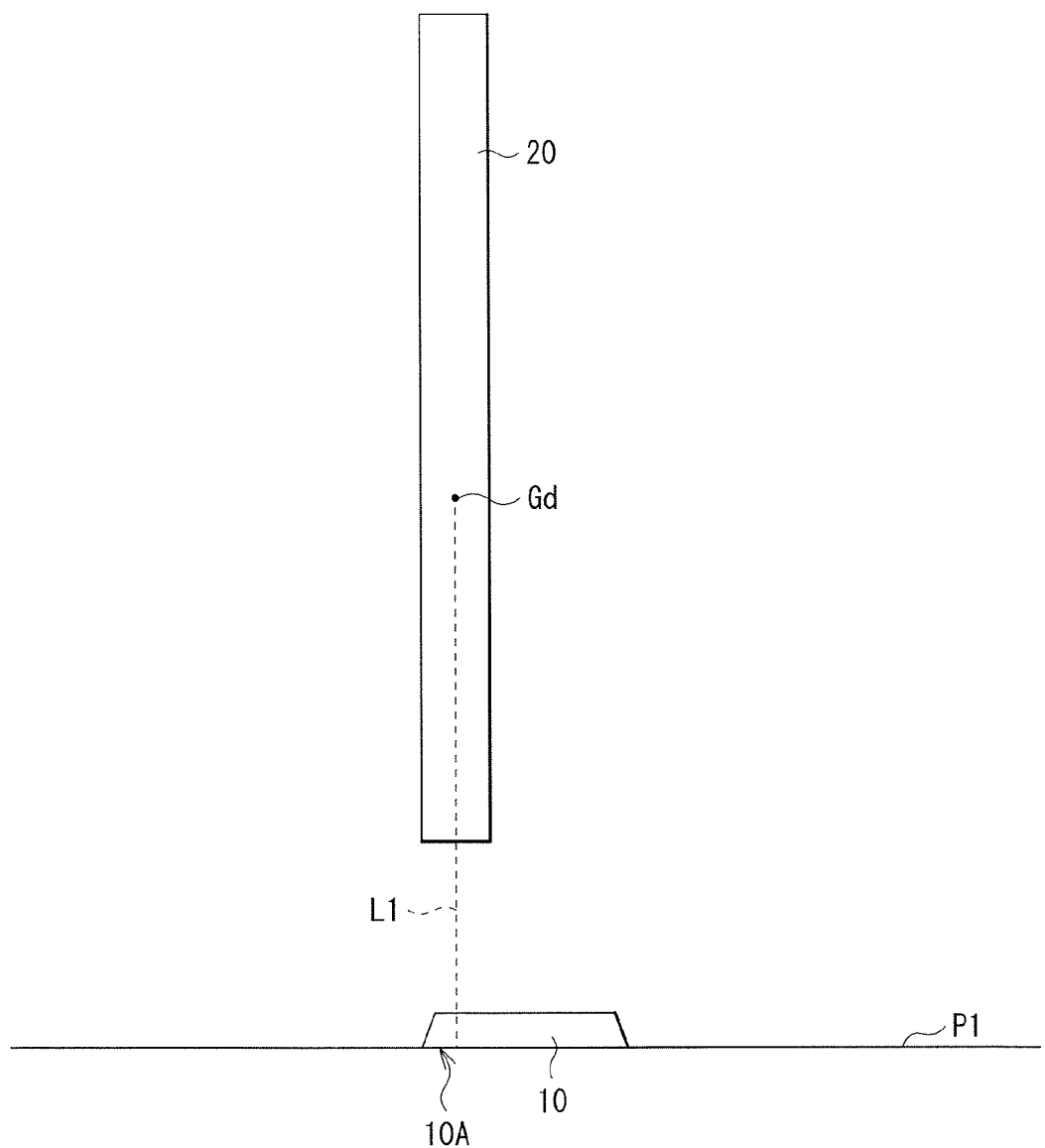
FIG. 6 is a left side view illustrating a method of manufacturing the display device shown in FIG. 1 in order of step.

First, as shown in FIG. 6, the contact portion 10A, of the stand 10, in contact with the installation plane P1 is set in any position below the display section 20. The stand 10 may be preferably in a position that does not exceed a position of a front end 20A of the display section 20. Also, the depth D1 of the stand 10 may be preferably as small as possible. However, these conditions are not limitative. The center of gravity Gd of the display section 20 is in a position that is lower in some degrees than the middle of the display section 20 as described above.

Figure 7:
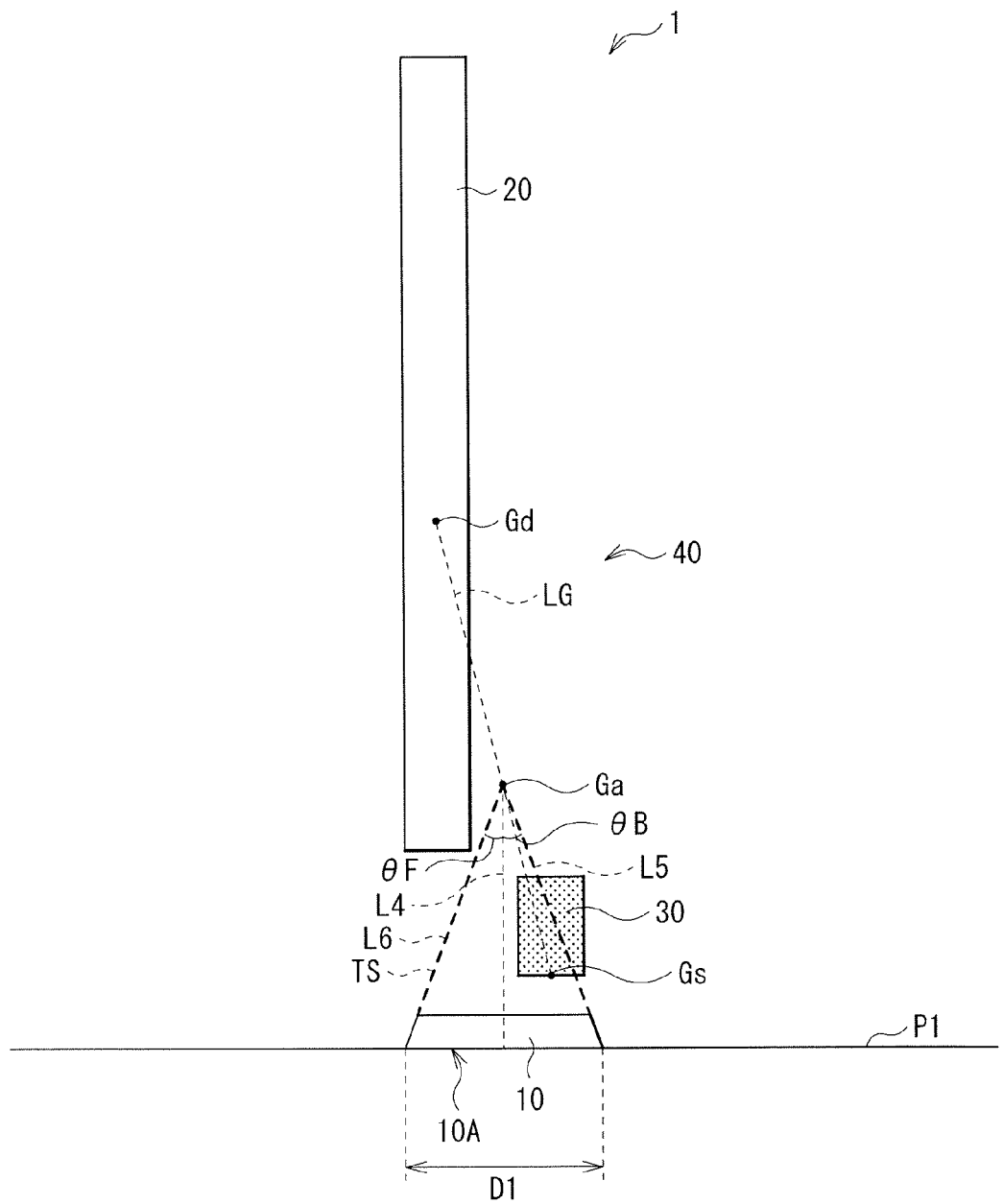
FIG. 7 is a left side view illustrating a step following a step shown in FIG. 6.

Subsequently, as shown in FIG. 7, the weight object 30 is provided on the back face side of the display section 20. The center of gravity Ga of the assembly 40 is allowed to be calculated based on the weight ratio between the display section 20 and the weight object 30 on the straight line LG that connects the center of gravity Gd of the display section 20 and the center of gravity Gs of the weight object 30. At this time, the position and the weight of the weight object 30 are determined by calculation so as to allow the center of gravity Ga of the assembly 40 to be positioned above the contact portion 10A, of the stand 10, in contact with the installation plane P1. It is to be noted that, when a weight of the display section 20 is 10 kg, for example, and the respective back-falling angle θB and the front-falling angle θF are 10°, for example, the weight of the weight object 30 is allowed to be reduced to about 4 kg to 5 kg, both inclusive.

In such a manner, in the present embodiment, the weight object 30 is provided on the back face side of the display section 20, and the contact portion 10A, of the stand 10, in contact with the installation plane P1 is allowed to be provided inside the above-described first triangle TL. Therefore, the installation area is reduced.

Second Embodiment

Figure 8:
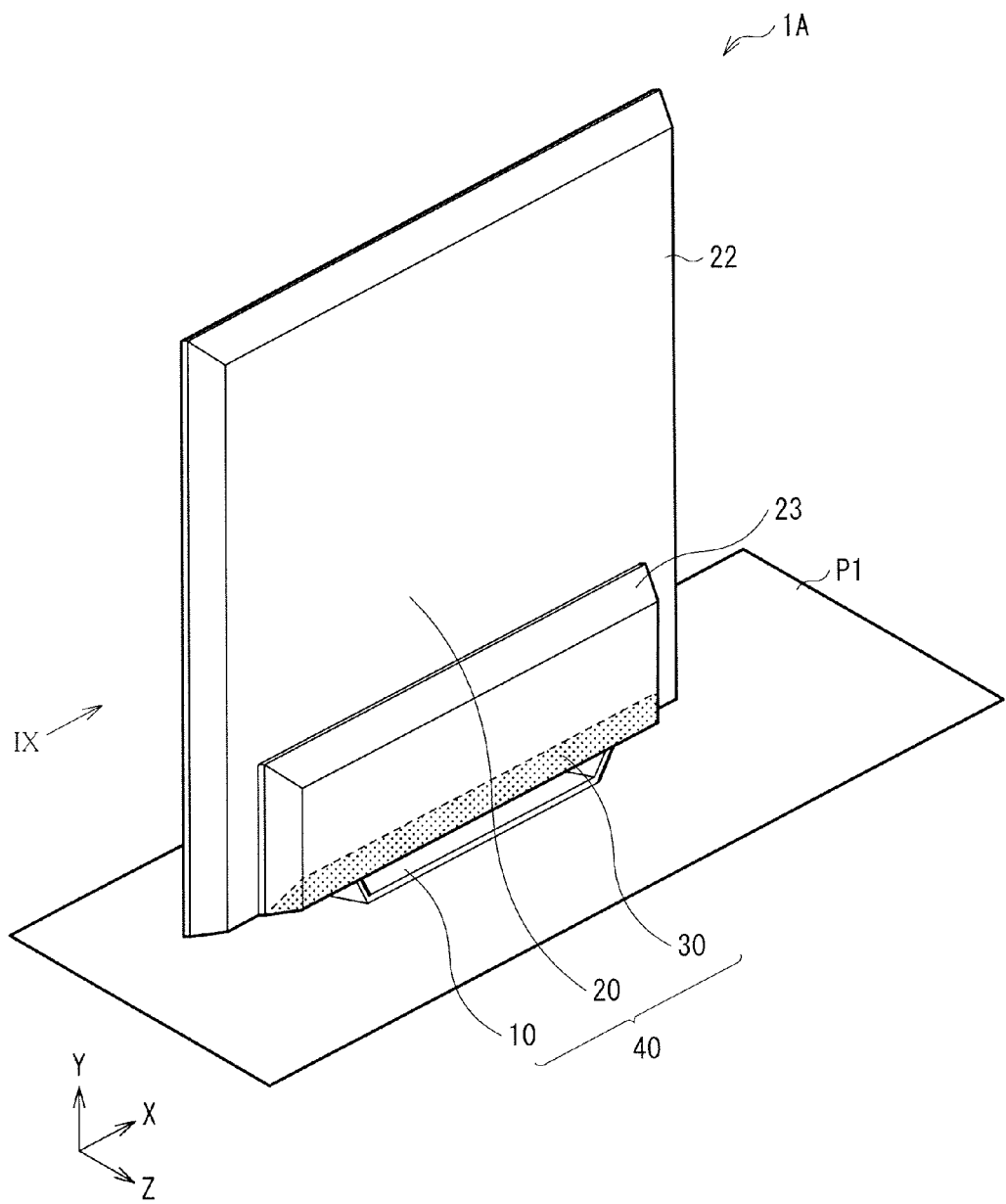
FIG. 8 is a perspective view illustrating an appearance of a display device according to a second embodiment of the present disclosure seen from a back face side thereof.
Figure 9:
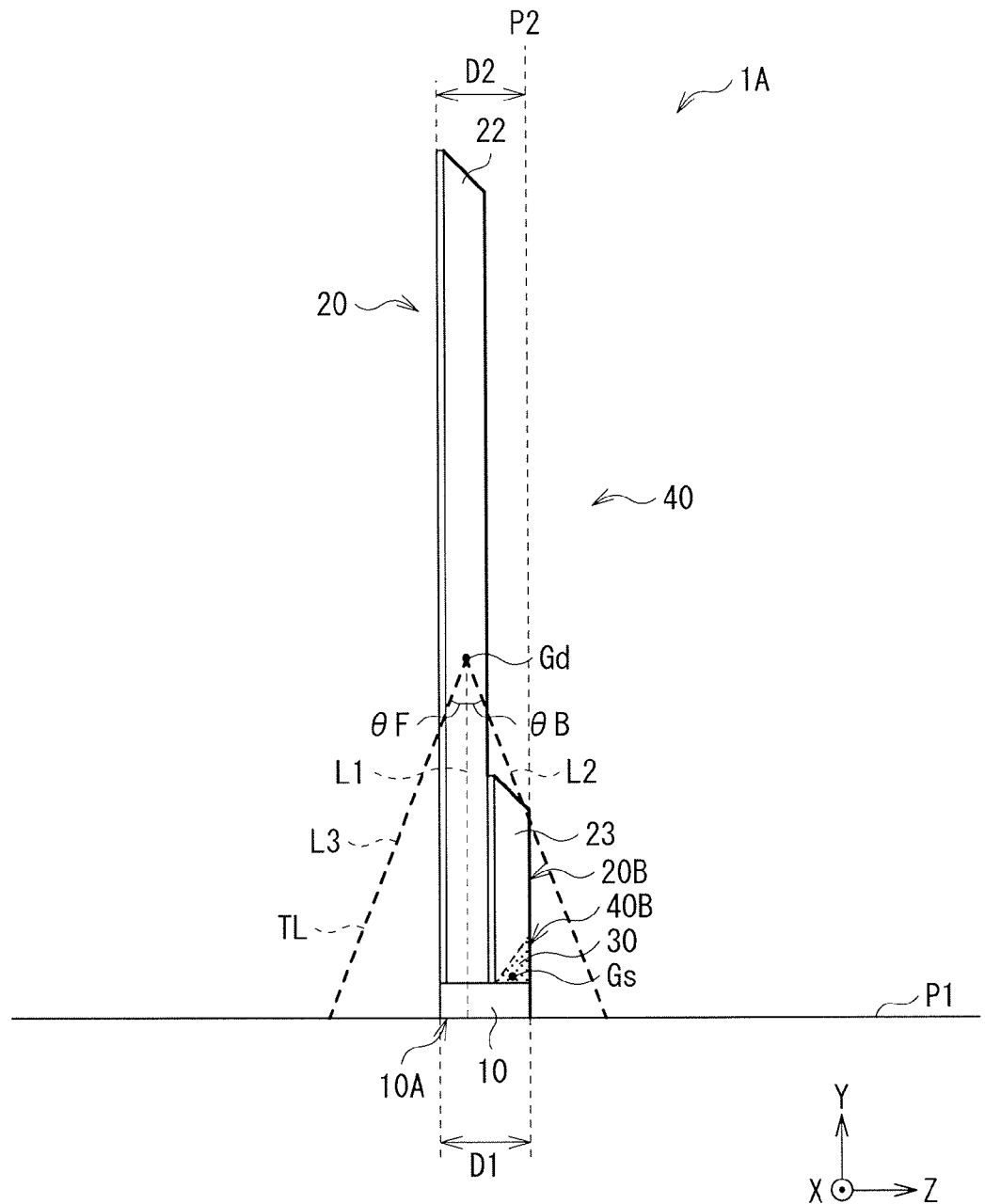
FIG. 9 is a left side view of the display device shown in FIG. 8.
Figure 10:
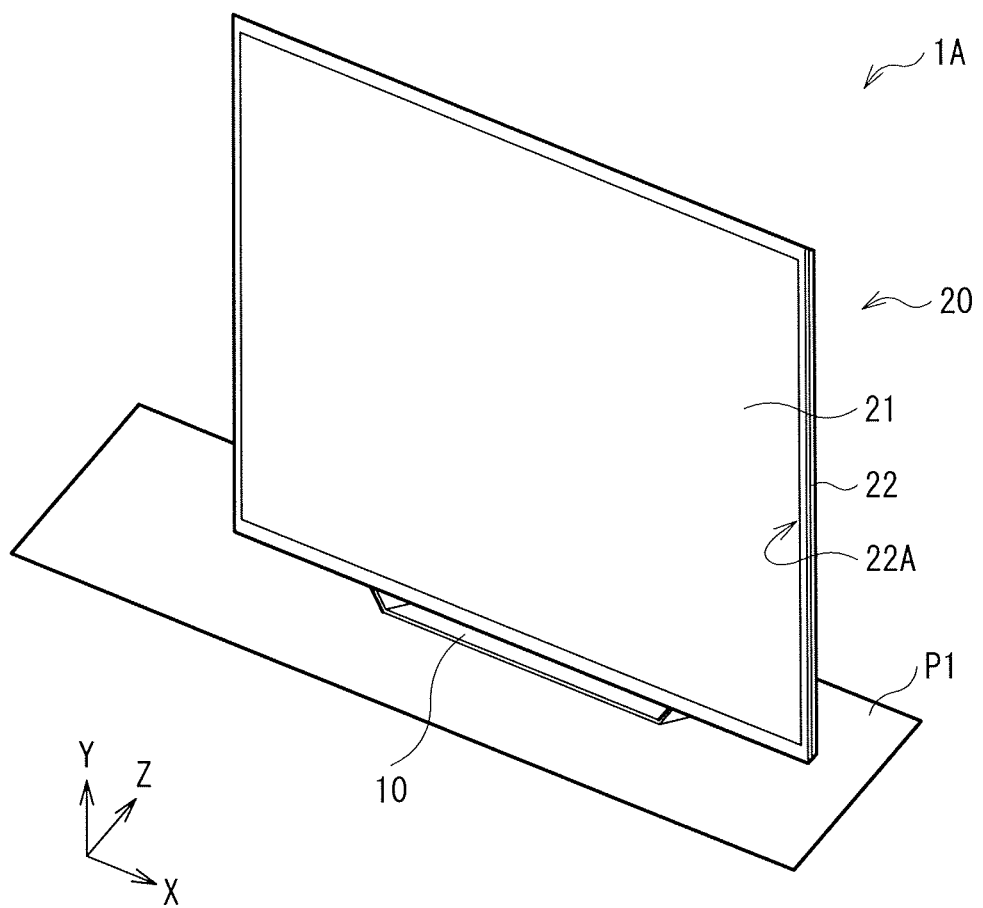
FIG. 10 is a perspective view illustrating the appearance of the display device shown in FIG. 8 seen from a front face side thereof.

FIG. 8 illustrates an appearance of a display device (a display device 1A) according to a second embodiment of the present disclosure seen from a back face side thereof. FIG. 9 illustrates the appearance of this display device seen from a direction of an arrow IX (seen from a left side thereof) in FIG. 8. FIG. 10 illustrates the appearance of this display device seen from a front face side thereof. The display device 1A has a configuration, functions, and effects similar to those in the above-described first embodiment, and is allowed to be manufactured in a manner similar to that in the above-described first embodiment, except that the weight object 30 is built inside the covering member 23 of the display section 20. Therefore, description will be given using the same numerals to designate the corresponding components.

In the display device 1A, the weight object 30 is built inside the covering member 23 of the display section 20 as described above. Therefore, a back end 40B of the assembly 40 is in a plane P2 that passes through a back end 20B of the display section 20 and is perpendicular to the installation plane P1. Accordingly, it is possible to arrange the display device 1A closer to a wall (such as a wall surface of a building or a wall surface at the back of a shelf). Therefore, it is possible to save a space in the back of the display device 1A.

Moreover, in the display device 1A, it is possible to allow the depth D1 of the stand 10 to be equal to a depth D2 of the display section 20. Therefore, it is possible to further reduce the installation area and the depth.

Figure 11:
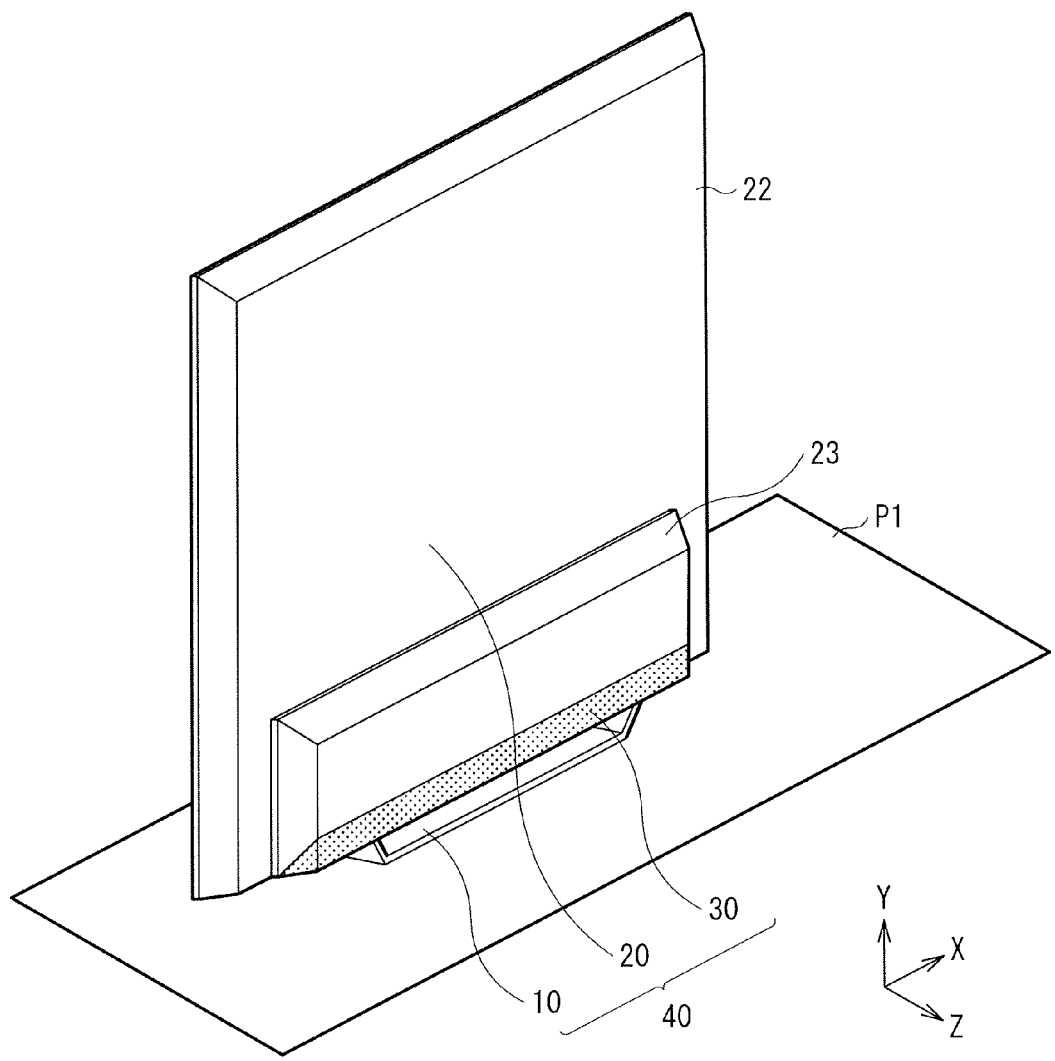
FIG. 11 is a perspective view for explaining an arrangement of a weight of the display device shown in FIG. 8.
Figure 12:
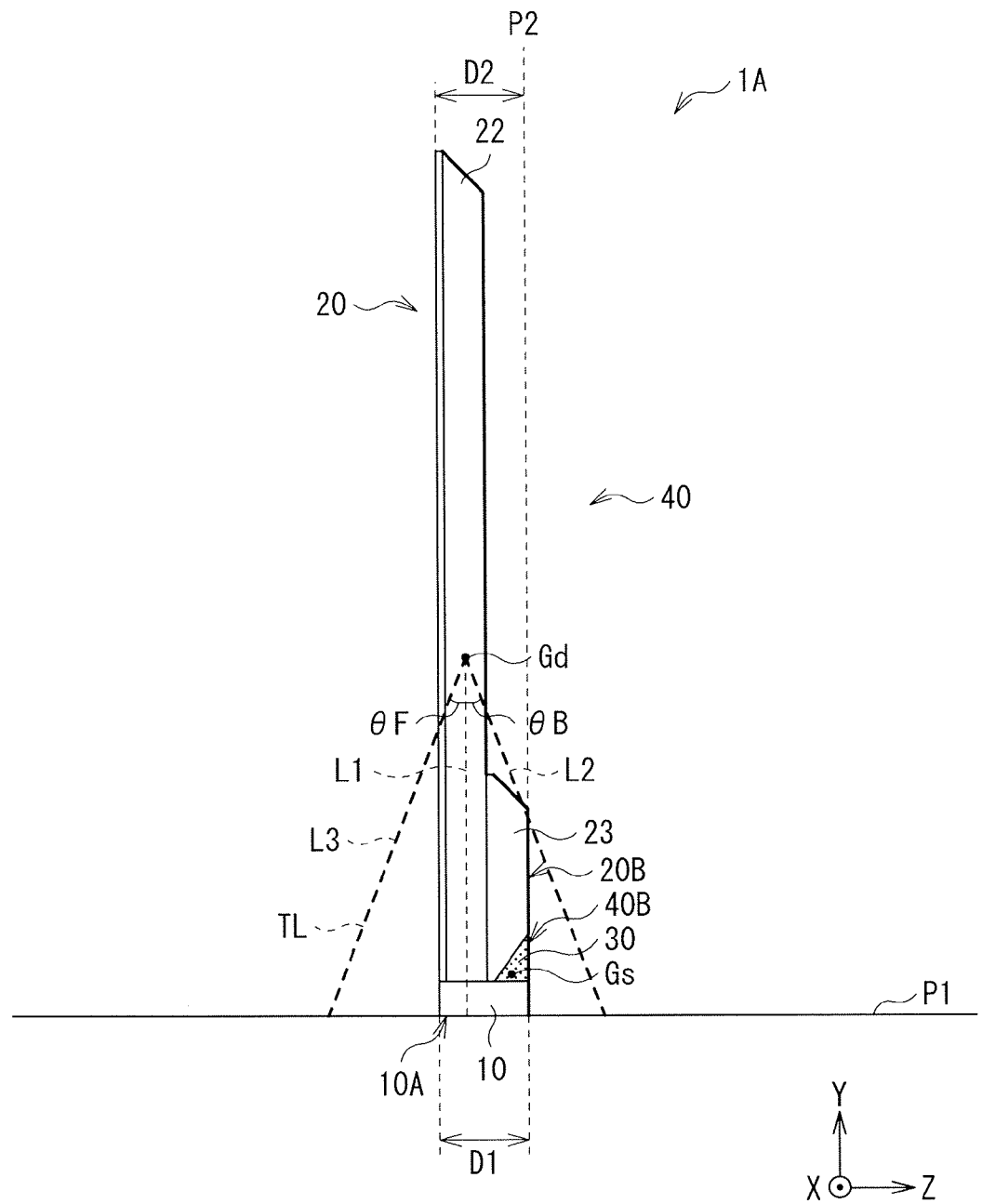
FIG. 12 is a left side view of the display device shown in FIG. 11.

The weight object 30 may be configured of the weight configured of a metal block as in the first embodiment. As shown in FIGS. 11 and 12, the weight object 30 may be preferably contained in a lowermost position inside the covering member 23, for example. One reason for this is that, by allowing the center of gravity Gs of the weight object 30 to be in a position as low as possible, it is possible to further reduce the depth D1 of the stand 10. The shape of the weight object 30 is not particularly limited. However, as shown in FIGS. 11 and 12, the weight object 30 may have a rod-like shape that has a triangle cross-section, for example.

Alternatively, one of a power source of the display section 20 and a speaker, which are not illustrated, may be used instead of the weight object 30.

Third Embodiment

Figure 13:
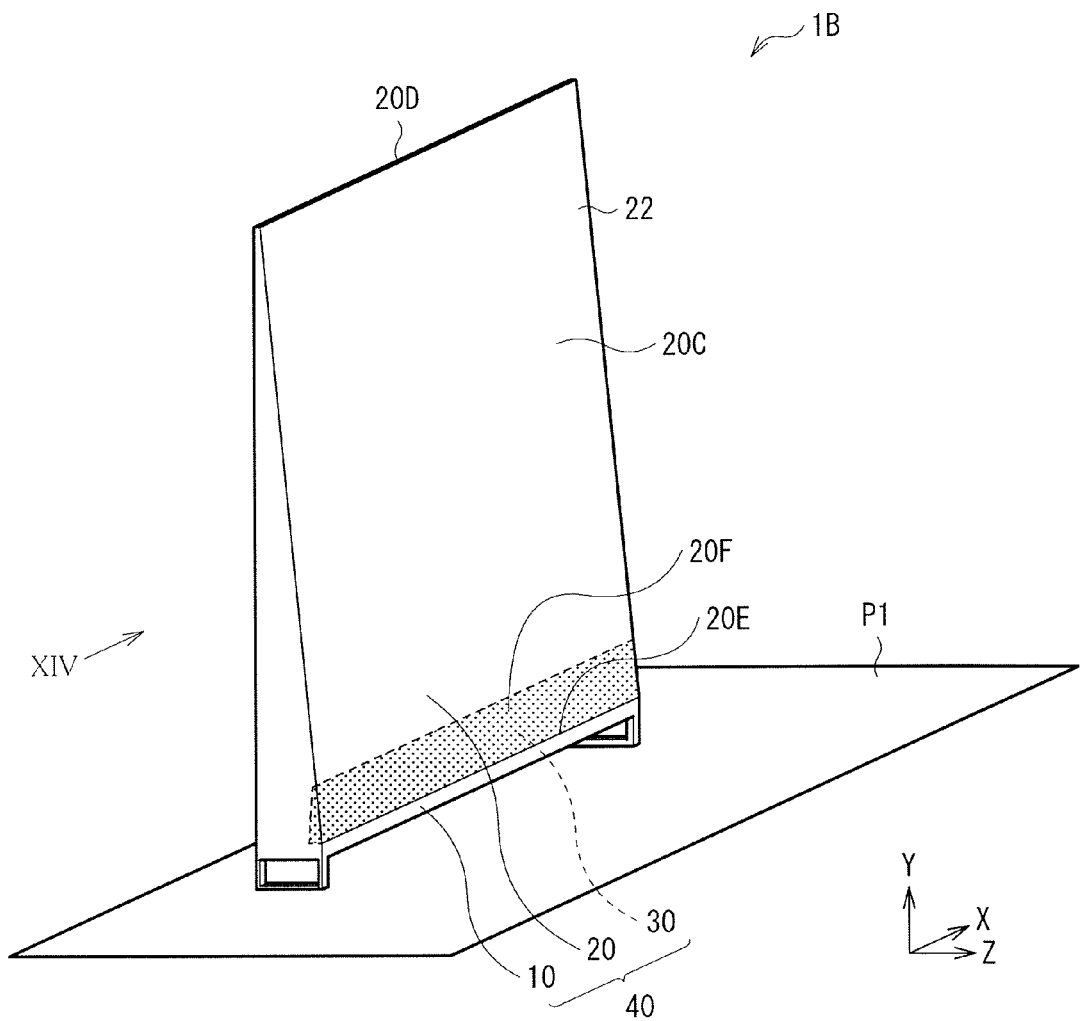
FIG. 13 is a perspective view illustrating a display device according to a third embodiment of the present disclosure seen from a back face side thereof.
Figure 14:
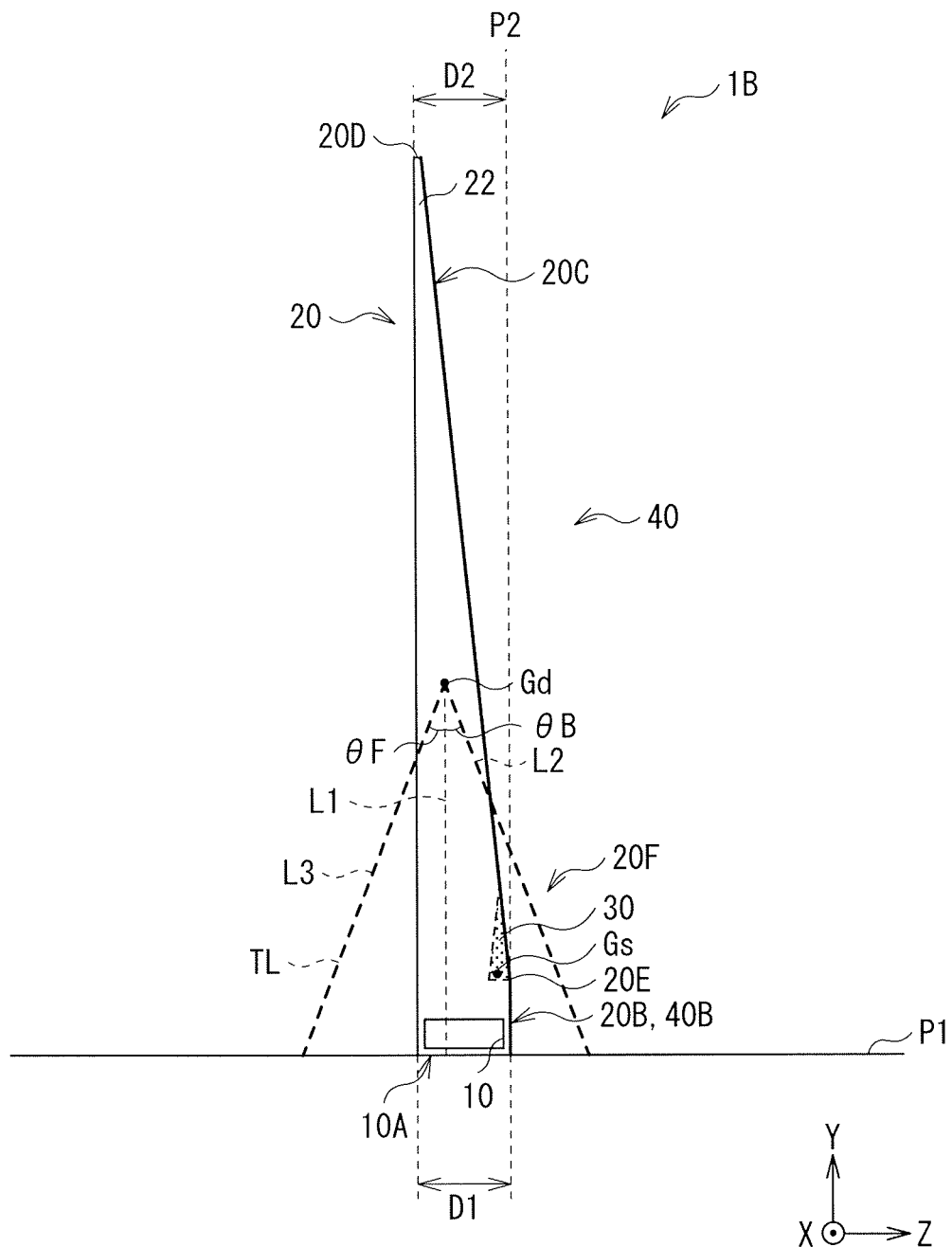
FIG. 14 is a left side view of the display device shown in FIG. 13.
Figure 15:
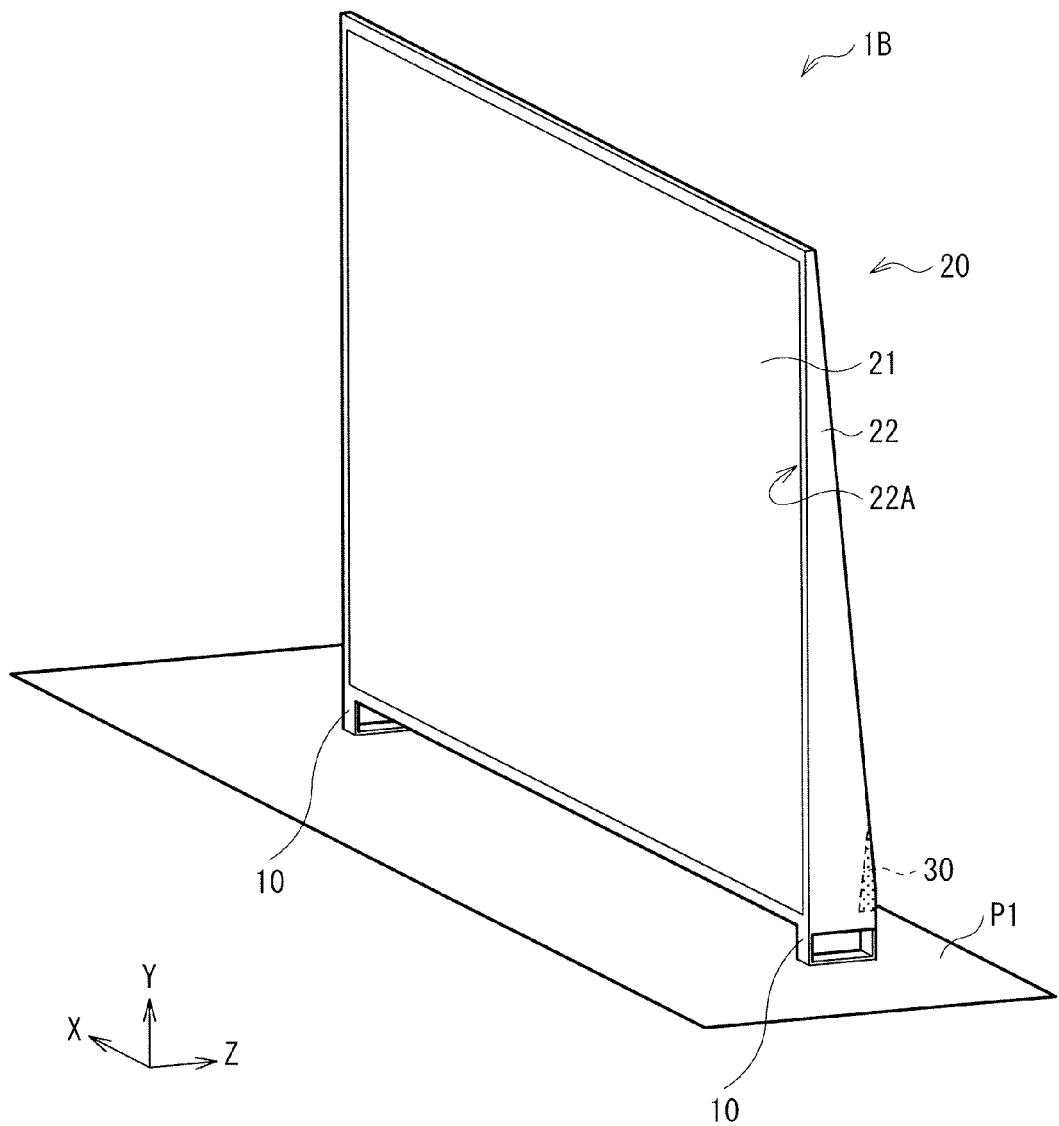
FIG. 15 is a perspective view illustrating the appearance of the display device shown in FIG. 13 seen from a front face side thereof.

FIG. 13 illustrates an appearance of a display device (a display device 1B) according to a third embodiment of the present disclosure seen from a back face side thereof. FIG. 14 illustrates the appearance of the display device seen from a direction of an arrow XIV (seen from a left side thereof) in FIG. 13. FIG. 15 illustrates the appearance of the display device seen from a front face side thereof. The display device 1B has a configuration, functions, and effects similar to those in the above-described second embodiment, and is allowed to be manufactured in a manner similar to that in the above-described second embodiment, except that the covering member 23 is integrated with the housing 22.

In the display device 1B, as in the second embodiment, the weight object 30 is built inside the housing 22 of the display section 20, and the back end 40B of the assembly 40 is in the plane P2 that passes through the back end 20B of the display section 20 and is perpendicular to the installation plane P1. Accordingly, it is possible to save a space in the back of the display device 1B, and it is possible to further reduce the installation area and the depth, as in the second embodiment.

A back face 20C of the display section 20 is a sloped face that has a constant slope. A thickness of the display section 20 is gradually increased from a top end 20D to a bottom end 20E. A lower portion 20F in which the thickness of the display section 20 is relatively large contains the weight object 30 similar to that in the second embodiment, together with the power source, the substrates, and the speaker (any of which is not illustrated). Alternatively, one of the power source of the display section 20 and the speaker may be used instead of the weight object 30, which is not illustrated.

Fourth Embodiment

Figure 16:
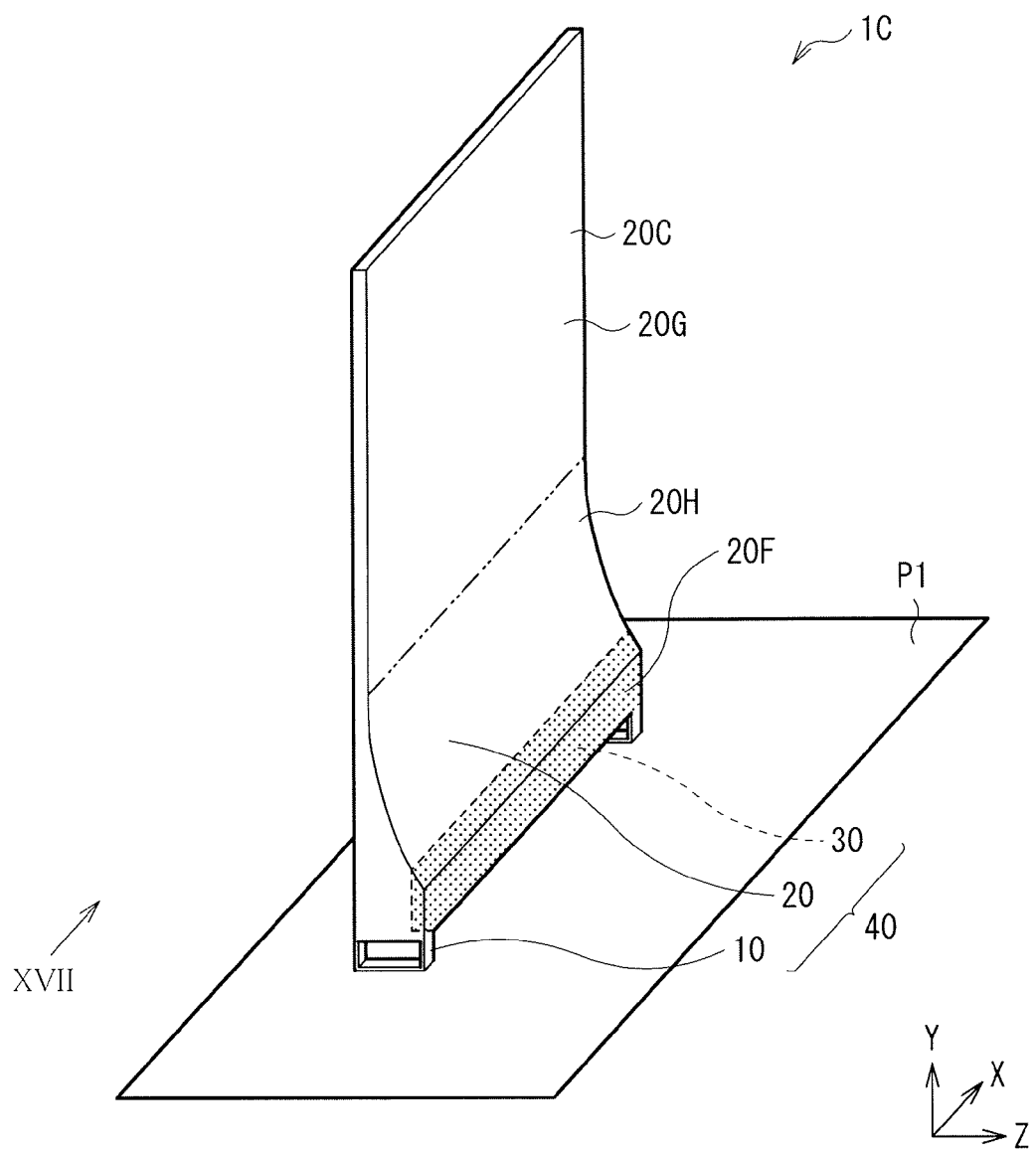
FIG. 16 is a perspective view illustrating a display device according to a fourth embodiment of the present disclosure seen from a back face side thereof.
Figure 17:
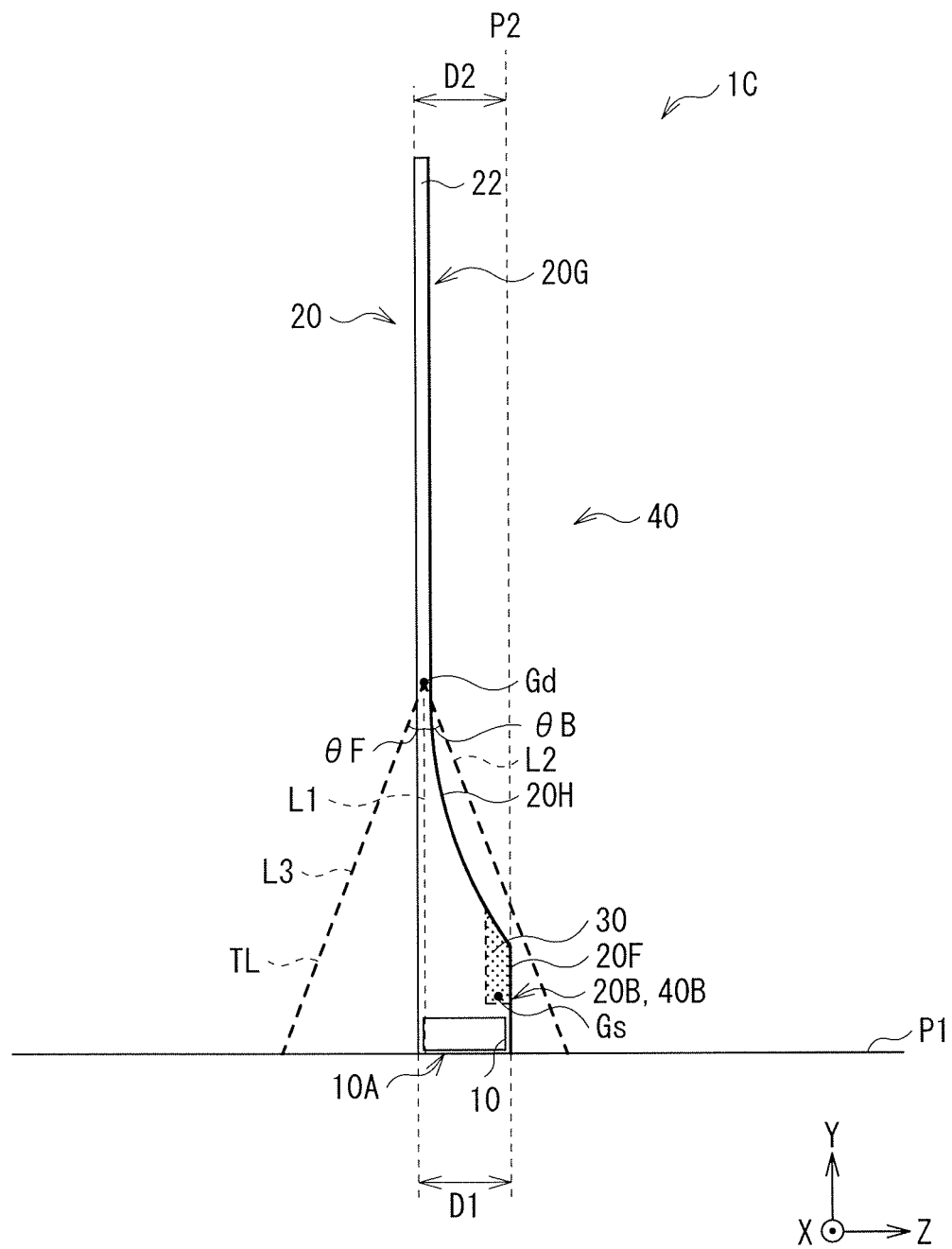
FIG. 17 is a left side view of the display device shown in FIG. 16.
Figure 18:
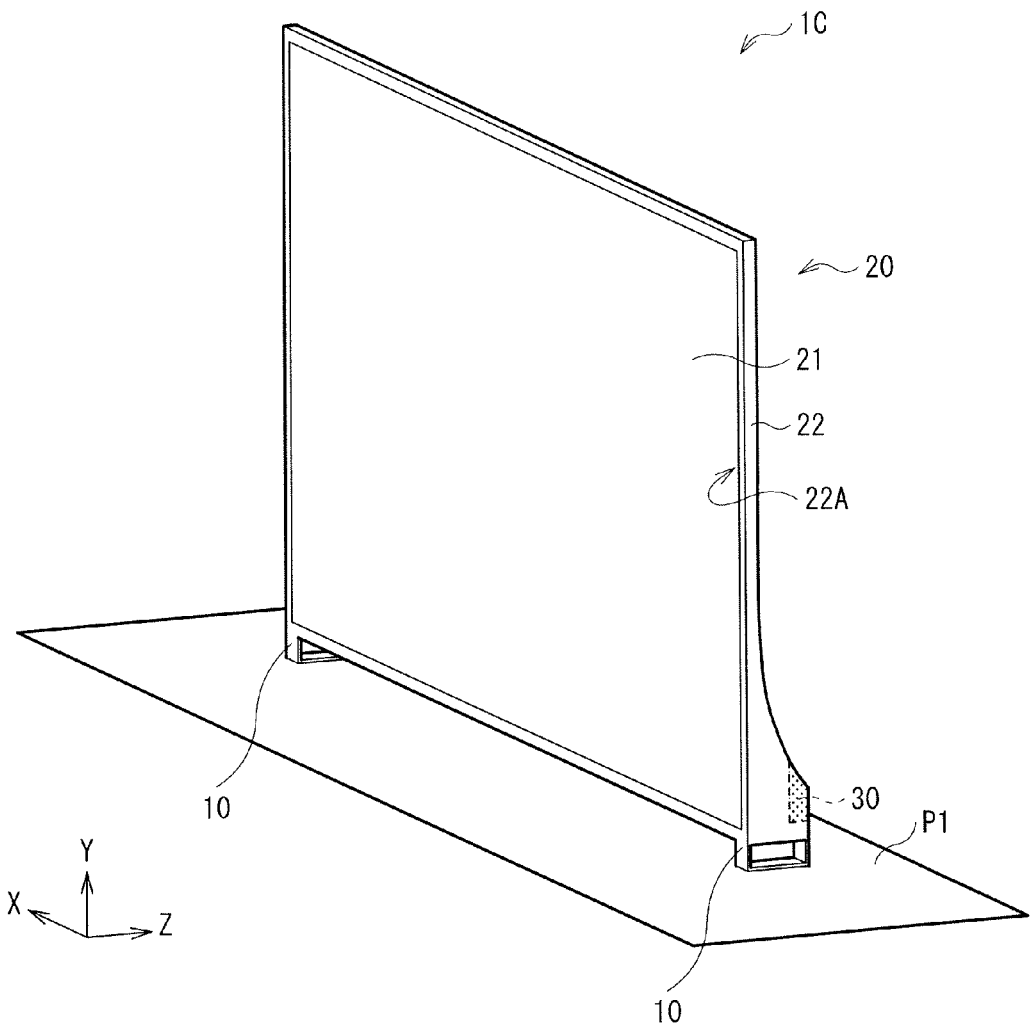
FIG. 18 is a perspective view illustrating the appearance of the display device shown in FIG. 17 seen from a front face side thereof.

FIG. 16 illustrates an appearance of a display device (a display device 1C) according to a fourth embodiment of the present disclosure seen from a back face side thereof. FIG. 17 illustrates the appearance of this display device seen from a direction of an arrow XVII (seen from a left side thereof) in FIG. 16. FIG. 18 illustrates the appearance of this display device seen from a front face side thereof. The display device 1C has a configuration, functions, and effects similar to those in the above-described third embodiment, and is allowed to be manufactured in a manner similar to that in the above-described third embodiment, except that the back face 20C of the display section 20 has a different shape.

In the display device 1C, as in the second embodiment, the weight object 30 is built inside the housing 22 of the display section 20, and the back end 40B of the assembly 40 is in the plane P2 that passes through the back end 20B of the display section 20 and is perpendicular to the installation plane P1. Accordingly, it is possible to save a space in the back of the display device 1C, and it is possible to further reduce the installation area and the depth, as in the second embodiment.

The back face 20C of the display section 20 has a transition portion 20H that has a curved face, and that connects an upper portion 20G in which the thickness of the display section 20 is smaller and the lower portion 20F in which the thickness of the display section 20 is larger. The lower portion 20F in which the thickness of the display section 20 is larger contains the weight object 30 similar to that in the second embodiment, together with the power source, the substrates, and the speaker (any of which is not illustrated). Alternatively, one of the power source of the display section 20 and the speaker may be used instead of the weight object 30, which is not illustrated. It is to be noted that the transition portion 20H may not necessarily have the curved face, and may have a sloped face.

Fifth Embodiment

Figure 19:
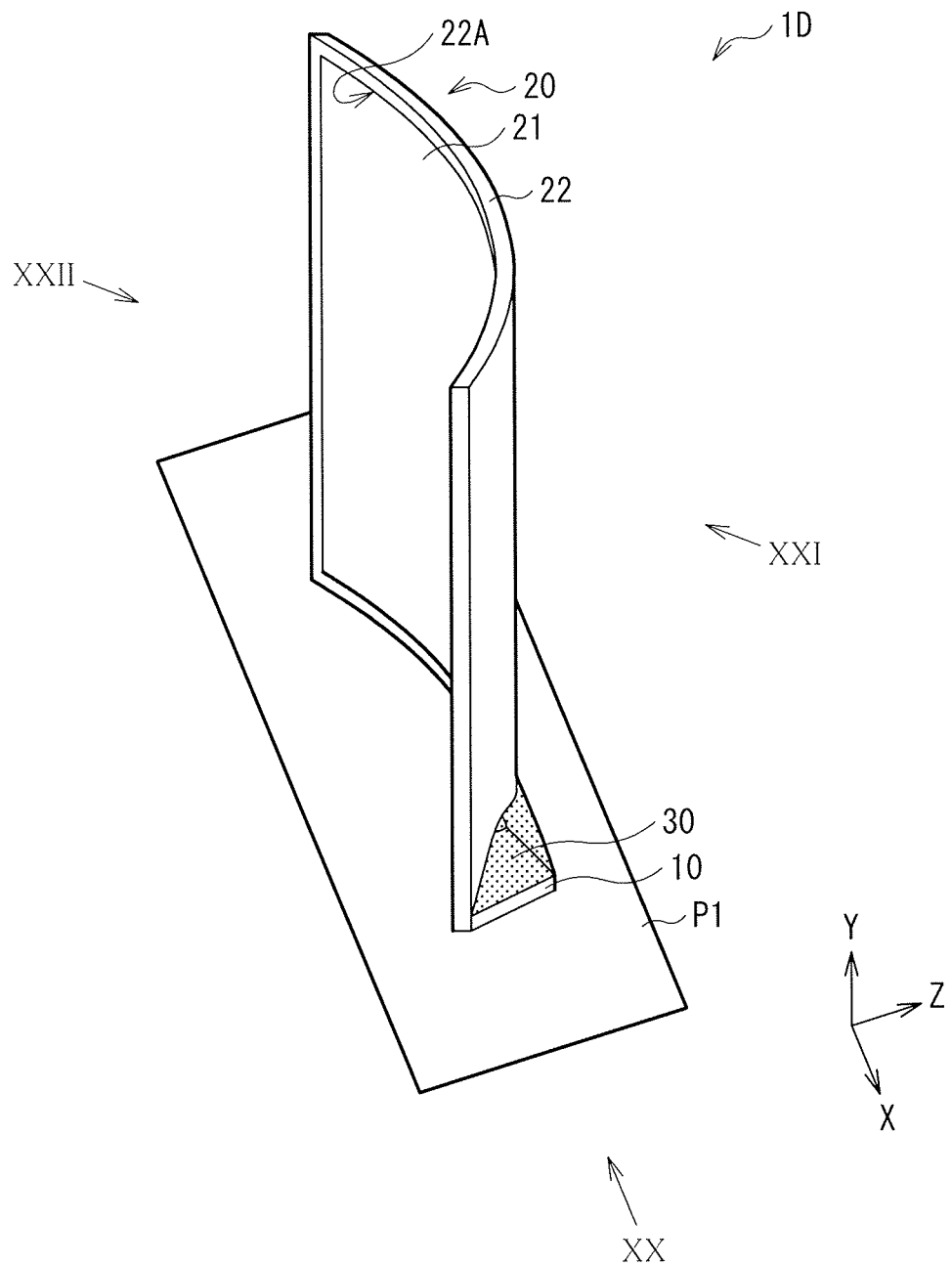
FIG. 19 is a perspective view illustrating an appearance of a display device according to a fifth embodiment of the present disclosure seen obliquely from the front.
Figure 20:
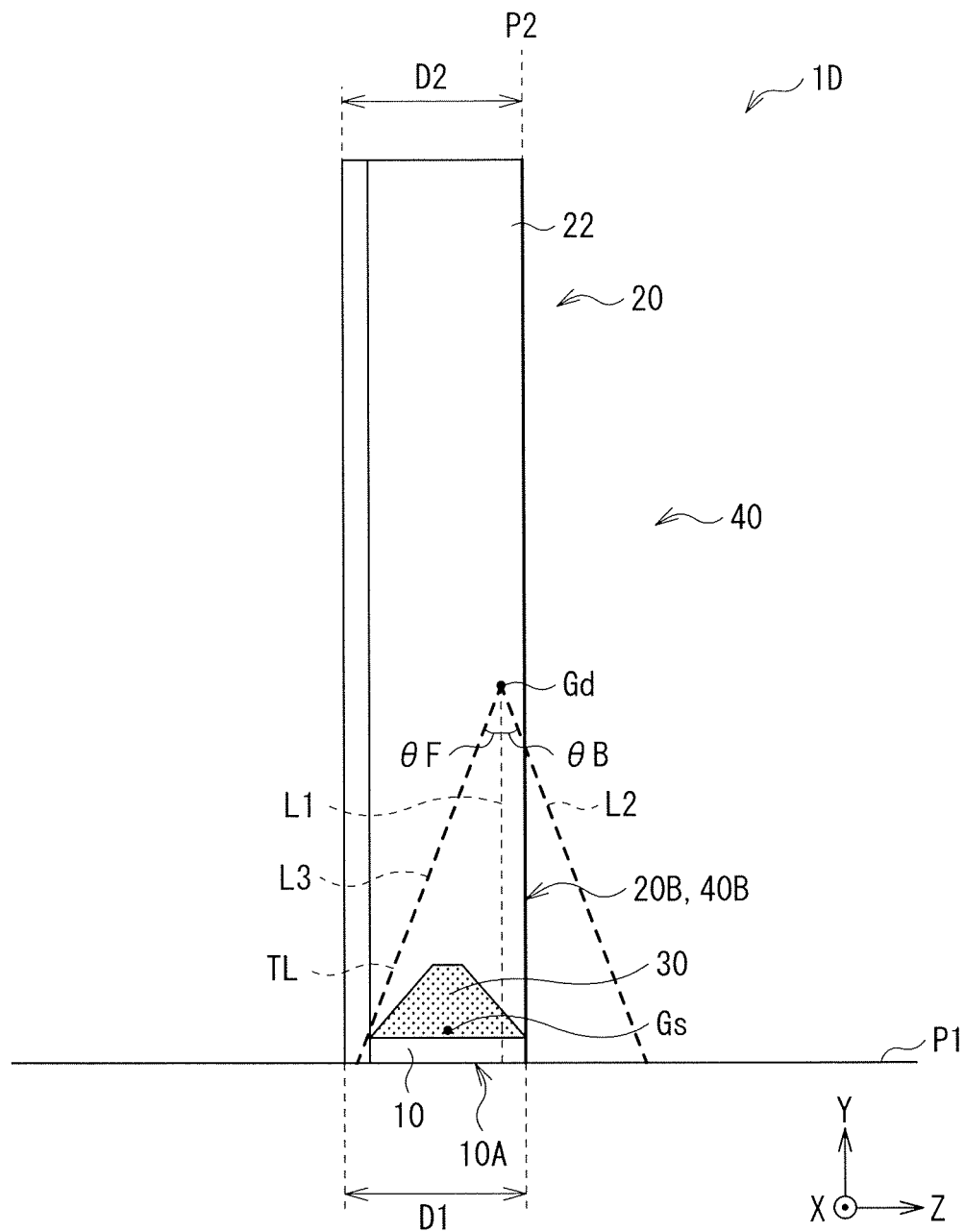
FIG. 20 is a left side view of the display device shown in FIG. 19.
Figure 21:
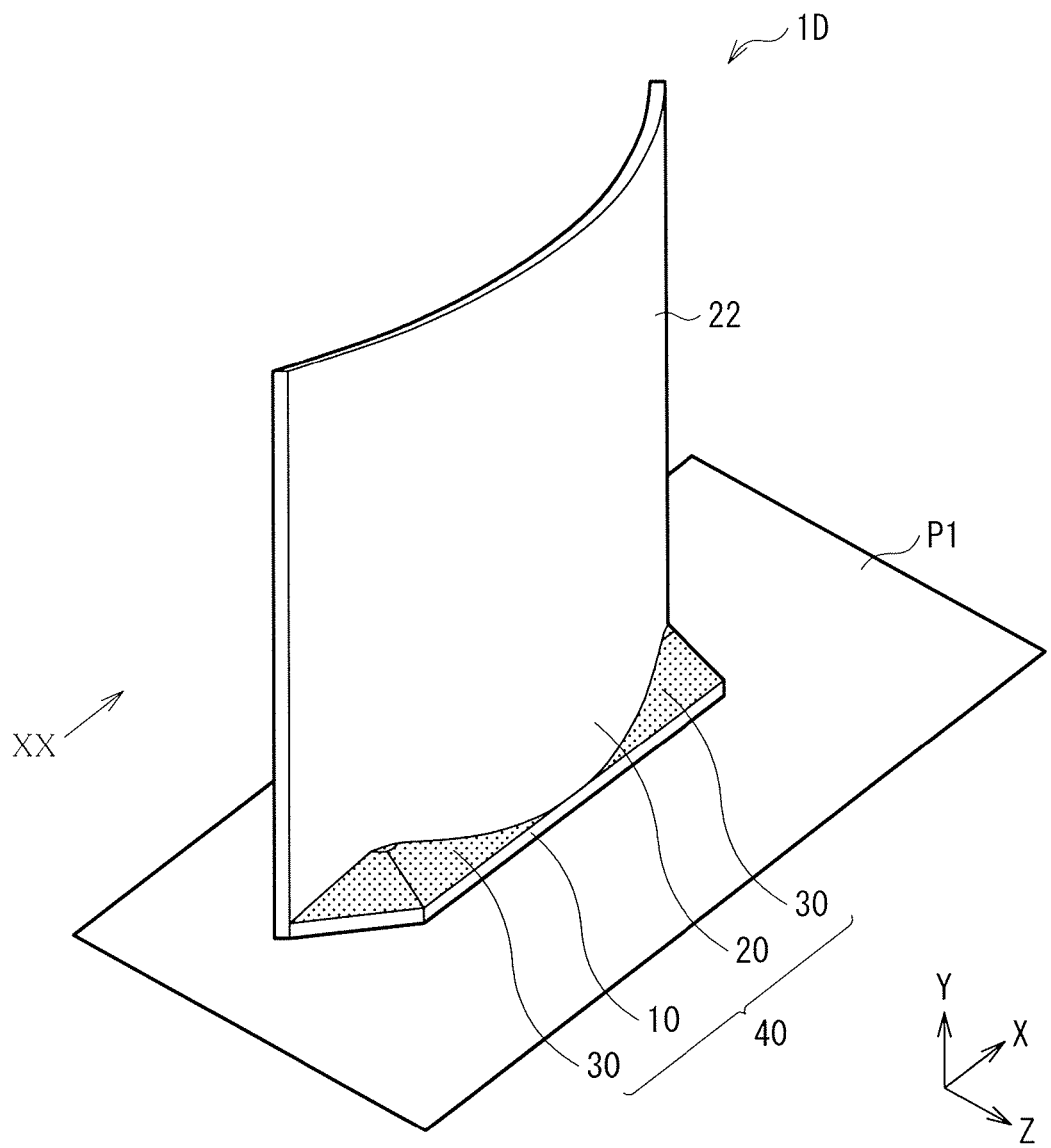
FIG. 21 is a perspective view illustrating an appearance of the display device shown in FIG. 19 seen obliquely from the back.
Figure 22:
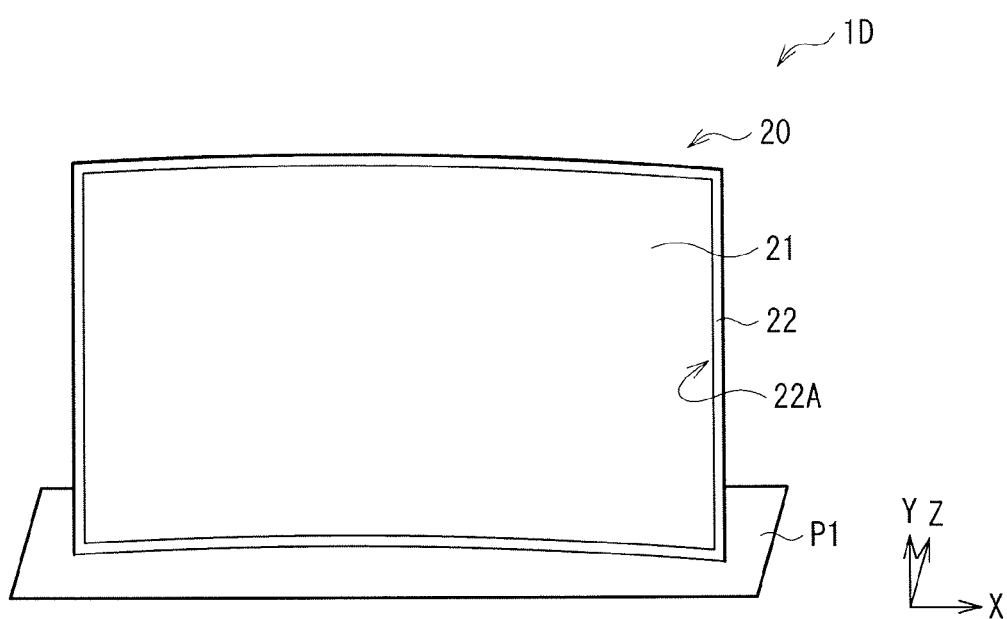
FIG. 22 is a front view of the display device shown in FIG. 19 seen from a front face side thereof.

FIG. 19 illustrates an appearance of a display device (a display device 1D) according to a fifth embodiment of the present disclosure seen from a back face side thereof. FIGS. 20 to 22 illustrate the appearance of this display device seen from a direction of an arrow XX (seen from a left side thereof), from a direction of an arrow XXI (seen obliquely from the back thereof), and from a direction of an arrow XXII (seen from the front thereof) in FIG. 19, respectively. The display device 1D has a configuration, functions, and effects similar to those in the above-described first embodiment, and is allowed to be manufactured in a manner similar to that in the above-described first embodiment, except that the display section 20 is curved in a one-dimensional direction (in the X direction).

Specifically, as shown in FIG. 19 or 21, the display section 20 may desirably have a circular-arc-like curved shape that curves protruding to the back (to the back face side), for example. Thus, when the display section 20 is seen from the front, the shape of the middle portion of the display section 20 becomes thinner more moderately compared to the shapes of the right and left portions thereof. Therefore, it is possible to produce a sense of unity and a sense of immersion by a visual effect in perspective.

The curved shape of the display section 20 may be preferably uniform in the Y direction. One reason for this is that, if the curvature varies in the Y direction, the display section 20 may be twisted in some local portion, and this may cause damage in the display section 20 or a display error.

The weight object 30 may be preferably provided, for example, on both end portions of the display section 20 in a curve direction of the display section 20. Specifically, the weight object 30 may be preferably provided, for example, in lower portions of right and left ends of the display section 20. One reason for this is as follows. When the display section 20 is curved to project in the back, the right and left ends are in positions that are on the front side compared to the position of the center of gravity Gd of the display section 20. Therefore, by arranging the weight object 30 at the both end portions (the right and left ends) of the display section 20 in the curve direction thereof, it is possible to allow the back end 40B of the assemble 40 to be in the plane P2 that passes through the back end 20B of the display section 20 and is perpendicular to the installation plane P1. Accordingly, it is possible to save a space in the back of the display device 1D, and it is possible to further reduce the installation area and the depth, as in the second embodiment.

Further, the power source, the substrates, or the speaker (any of which is not illustrated) may be arranged on the right and left ends of the back face of the display section 20. By arranging the power source, the substrates, or the speaker at the right and left ends of the display section 20 in such a manner, it is possible to surely support the power source, the substrates, or the speaker by the weight object 30. Further, by arranging the speaker at the right and left ends of the display section 20, images and audio are integrated without being visually separated. Therefore, it is possible to further improve the sense of unity and the sense of immersion together with the above-described visual effect in perspective due to the curve of the display section 20.

It is to be noted that the weight object 30 may not be necessarily provided in the lower portion of the right and left ends of the display section 20. Alternatively, the weight object 30 may be provided in the lower portion of the middle of the display section 20, which is not illustrated, as in the first embodiment.

Hereinabove, the present disclosure has been described referring to some embodiments. However, the present disclosure is not limited to the above-described embodiments, and may be variously modified. For example, in the above-described embodiments, description has been given on the case in which the back-falling angle θB of the assembly 40 is 10°, for example, and the front-falling angle θF of the assembly 40 is 10°, for example. However, the back-falling angle θB and the front-falling angle θF may each be set to an angle larger than 10° as long as the angle satisfies the above-described standard. Further, the back-falling angle θB and the front-falling angle θF may be equal to each other, or may be different from each other, as long as the back-falling angle θB and the front-falling angle θF satisfy the above-described standard.

For example, in the above embodiments, description has been given on the configuration of the display device 1 (the television) as a specific example. However, it is not necessary to provide all of the components, and other components may be further provided.

Moreover, for example, the materials, the dimensions, the shapes, etc. of the respective components described in the above embodiments are not limitative, and other materials, other dimensions, other shapes, etc. may be adopted.

The present disclosure is applicable, in addition to the television described in the above embodiments, also to other display devices such as a monitor.

It is possible to achieve at least the following configurations from the above-described example embodiments and the modifications of the disclosure.

(1) A display device including
an assembly including
a stand placed on an installation plane,
a flat-plate-like display section supported by the stand, and
a weight object provided on a back face side of the display section,
the stand having a contact portion in contact with the installation plane, the contact portion being provided inside a first triangle formed by a second straight line, a third straight line, and the installation plane, the second straight line passing through center of gravity of the display section and forming, with respect to a first straight line, an angle equal to a back-falling angle of the assembly, the third straight line passing through the center of gravity of the display section and forming, with respect to the first straight line, an angle equal to a front-falling angle of the assembly, and the first straight line passing through the center of gravity of the display section and being perpendicular to the installation plane.

(2) The display device according to (1), wherein the contact portion, of the stand, in contact with the installation plane configures a base of a second triangle formed by a fifth straight line, a sixth straight line, and the installation plane, the fifth straight line passing through center of gravity of the assembly and forming, with respect to a fourth straight line, an angle equal to the back-falling angle of the assembly, the sixth straight line passing through the center of gravity of the assembly and forming, with respect to the fourth straight line, an angle equal to the front-falling angle of the assembly, and the fourth straight line passing through the center of gravity of the assembly and being perpendicular to the installation plane.

(3) The display device according to (2), wherein a position and weight of the weight object is adjusted to allow the second triangle to be formed inside the first triangle.

(4) The display device according to any one of (1) to (3), wherein a back end of the assembly is in a plane that passes through a back end of the display section and is perpendicular to the installation plane.

(5) The display device according to any one of (1) to (4), wherein the weight object is a weight configured of a metal block.

(6) The display device according to any one of (1) to (5), wherein the weight object is built in the display section.

(7) The display device according to (6), wherein the weight object is one of a power source of the display section and a speaker.

(8) The display device according to any one of (1) to (7), wherein the display section is curved in a one-dimensional direction.

(9) The display device according to (8), wherein the weight object is provided at both ends of the display section in a curve direction of the display section.

It should be understood by those skilled in the art that various modifications, combinations, sub-combinations, and alterations may occur depending on design requirements and other factors insofar as they are within the scope of the appended claims or the equivalents thereof.

What is claimed is:

1. A display device comprising
an assembly including:
a stand placed on an installation plane, and
a display section supported by the stand, the display section including:
a display; and
a weight object located rearward of a back face side of the display, the stand having a contact portion in contact with the installation plane, the contact portion being provided inside a first triangle formed by a second straight line, a third straight line, and the installation plane, the second straight line passing through center of gravity of the display section and forming, with respect to a first straight line, an angle equal to a back-falling angle of the display section, the third straight line passing through the center of gravity of the display section and forming, with respect to the first straight line, an angle equal to a front-falling angle of the display section, and the first straight line passing through center of gravity of the display section and being perpendicular to the installation plane.

2. The display device according to claim 1, wherein a back end of the assembly is in a plane that passes through a back end of the display section and is perpendicular to the installation plane.

3. The display device according to claim 1, wherein the weight object is a weight configured as a metal block.

4. The display device according to claim 1, wherein the weight object is built in the display section.

5. The display device according to claim 4, wherein the weight object is one of a power source of the display section and a speaker.

6. The display device according to claim 1, wherein the display section includes a display panel made of liquid crystal or organic electroluminescence.

7. A display device comprising
an assembly including:
a stand placed on an installation plane, and a display section supported by the stand, the display section including:
a display; and
a weight object provided adjacent to a back face side of the display, the stand having a contact portion in contact with the installation plane,
wherein, when viewed from a side of the display device, a footprint of the contact portion is within a footprint of the display section.

8. The display device according to claim 7, the display section includes a display panel made of liquid crystal or organic electroluminescence.

9. The display device according to claim 7, wherein the weight object is located rearward of the display.

\* \* \* \* \*